«12» United States Patent
Nakano

(10) Patent No.: US 10,410,887 B2
(45) Date of Patent: Sep. 10, 2019

(54) SUBSTRATE PROCESSING APPARATUS AND SUBSTRATE PROCESSING METHOD

(71) Applicant: SCREEN Holdings Co., Ltd., Kyoto (JP)

(72) Inventor: Akiyoshi Nakano, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 15/823,704

(22) Filed: Nov. 28, 2017

(65) Prior Publication Data
US 2018/0182645 A1 Jun. 28, 2018

(30) Foreign Application Priority Data

Dec. 28, 2016 (JP) .................. 2016-255240

(51) Int. Cl.
H01L 21/67 (2006.01)
H01L 21/02 (2006.01)
(Continued)

(52) U.S. Cl.
CPC .......... H01L 21/67023 (2013.01); B08B 3/10 (2013.01); H01L 21/0209 (2013.01);
(Continued)

(58) Field of Classification Search
None
See application file for complete search history.

(56) References Cited

U.S. PATENT DOCUMENTS 8,268,087 B2 * 9/2012 Kamikawa ........ H01L 21/67051
134/133
9,601,357 B2 * 3/2017 Hashimoto ....... H01L 21/67051
(Continued)

FOREIGN PATENT DOCUMENTS

JP      5005770 B2    8/2012
JP    2014-038949    2/2014
(Continued)

OTHER PUBLICATIONS

Office Action for Taiwanese Application No. 106139830 dated Mar. 6, 2019 and English translation based on the Japanese translation attached.

(Continued)

Primary Examiner — Sylvia Macarthur
(74) Attorney, Agent, or Firm — Ostrolenk Faber LLP

(57) ABSTRACT

A substrate processing apparatus has a base part facing a surface of a rotation table, and the base part is equipped with a plate member which is rotated by a rotation drive unit together with the rotation table while the base member is being disposed between the rotation table and a substrate W held by a plurality of substrate holding members. The substrate processing apparatus is further equipped with: a heating fluid supply unit and a cooling fluid supply unit each of which is provided between the rotation table and the plate member and supplies a temperature regulating fluid for temperature regulation of the plate member; and a controller which controls supply of the temperature regulating fluids from the heating fluid supply unit and the cooling fluid supply unit.

14 Claims, 15 Drawing Sheets

(51) Int. Cl.
*B08B 3/10* (2006.01)
*H01L 21/306* (2006.01)
*H01L 21/3213* (2006.01)
*H01L 21/687* (2006.01)

(52) U.S. Cl.
CPC .. *H01L 21/02087* (2013.01); *H01L 21/30604* (2013.01); *H01L 21/32134* (2013.01); *H01L 21/6708* (2013.01); *H01L 21/67051* (2013.01); *H01L 21/67109* (2013.01); *H01L 21/67248* (2013.01); *H01L 21/68728* (2013.01); *H01L 21/68764* (2013.01)

(56) References Cited

U.S. PATENT DOCUMENTS

| | | | | |
|---|---|---|---|---|
| 9,698,031 | B2* | 7/2017 | Kobayashi | C23C 16/458 |
| 9,728,443 | B2* | 8/2017 | Yoshihara | H01L 21/68764 |
| 9,786,522 | B2* | 10/2017 | Kobayashi | H01L 21/67028 |
| 2009/0087932 | A1 | 4/2009 | Kondoh | 156/345.27 |
| 2009/0325469 | A1* | 12/2009 | Koo | B24B 37/30 451/54 |
| 2010/0083986 | A1 | 4/2010 | Kamikawa et al. | |
| 2015/0075571 | A1 | 3/2015 | Miura | |
| 2015/0090694 | A1 | 4/2015 | Hashimoto et al. | |
| 2017/0170032 | A1* | 6/2017 | Shibayama | H01L 21/30604 |
| 2018/0182645 | A1* | 6/2018 | Nakano | H01L 21/67109 |

FOREIGN PATENT DOCUMENTS

| | | |
|---|---|---|
| JP | 2015-162597 | 9/2015 |
| KR | 10-1036605 B1 | 5/2011 |
| KR | 10-2014-0141609 A | 12/2014 |
| TW | 200926332 A | 6/2009 |

OTHER PUBLICATIONS

Taiwan Office Action for Taiwan Application No. 106139830 dated Jul. 20, 2018 and its English translation of the Taiwan Office Action based on the Japanese translation attached.

Notification of Reason for Refusal dated May 30, 2019 in counterpart Korean Patent Application No. 10-2017-0163046 with English translation obtained from One Portal Dossier.

* cited by examiner

SUBSTRATE PROCESSING APPARATUS AND SUBSTRATE PROCESSING METHOD

BACKGROUND OF THE INVENTION

Field of the Invention

The present invention relates to a technology for processing a substrate and, in particular, to a technology for regulating temperature of a substrate.

Description of the Background Art

In a process of a substrate such as a semiconductor wafer, temperature regulation processing, in which the substrate is heated or cooled, is performed in some cases while the substrate is being processed with a processing liquid.

As such a technology for regulating temperature of a substrate, there is disclosed a technology in which a high-temperature chemical liquid, steam, or the like is discharged toward, for example, a back surface of the substrate to raise the temperature of the substrate (for example, Japanese Patent Application Laid-Open No. 2014-038949). In addition, there is disclosed a technology in which a heater is disposed in contact which or close to a back surface of a substrate to raise the temperature of the substrate (for example, Japanese Patent Application Laid-Open No. 2015-162597).

However, in the case of the technology in Japanese Patent Application Laid-Open No. 2014-038949, since a heated chemical liquid or the like is directly discharged toward the substrate, usable chemical liquids or the like may be limited.

Further, in the case of using a heater as in Japanese Patent Application Laid-Open No. 2015-162597, chemical liquids are not so likely to be limited as in Japanese Patent Application Laid-Open No. 2014-038949; however, the use of a heater may causes some problems.

For example, a power cable and the like are connected to a heater; it is difficult to rotate the heater itself. For this reason, if a processing liquid is dropped on the heater, it is difficult to remove the processing liquid from the heater. Therefore, since the heater is disposed close to the back surface of the substrate, the back surface of the substrate can be contaminated with the processing liquid which is bounced or evaporated by the heater.

SUMMARY OF THE INVENTION

The present invention is directed to a substrate processing apparatus for processing a substrate.

According to the present invention, a substrate processing apparatus for processing a substrate includes: a rotation table which rotates around a predetermined rotation axial line; a rotation drive unit which rotates the rotation table around the rotation axial line; a substrate holding member which is provided on a surface on one side of the rotation table and holds the substrate, away from the rotation table, at a position on the one side; a plate member which has a base part opposed to the surface on the one side of the rotation table and is rotated, by the rotation drive unit, together with the rotation table while the base part is being disposed between the rotation table and the substrate held by the substrate holding member; and a temperature regulating fluid supply unit which supplies, between the rotation table and the plate member, a temperature regulating fluid for temperature regulation of the plate member.

With this substrate processing apparatus, the temperature regulating fluid is supplied between the plate member and the rotation table, whereby the plate member is temperature-regulated. By this operation, the substrate provided on one side of the temperature regulating plate is temperature-regulated. Further, since the plate member also rotates together with the rotation table which rotates the substrate, even if the processing liquid supplied to the rotating substrate is attached to the surface of the plate member, the processing liquid can be moved outwardly by centrifugal force. This arrangement can reduce contamination on the back surface of the substrate.

The substrate processing apparatus is preferably further equipped with a plate member moving mechanism which moves the plate member between (i) a first position which is on the one side with respect to the rotation table and (ii) a second position which is closer to a back surface of the substrate held by the substrate holding member than the first position is.

With this substrate processing apparatus, the plate member can be moved from the first position to the second position to position the plate member close to the substrate. By supplying a temperature regulating fluid in this state, the substrate can be effectively temperature-regulated. Further, by moving the plate member from the second position to the first position after regulating the temperature of the substrate, the plate member can be separated away from the substrate. By this operation, the temperature regulation of the substrate can be quickly stopped; therefore, it is possible to prevent or reduce effect to the process.

Preferably, the plate member moving mechanism includes: a first magnet part provided on the plate member; a second magnet part provided on the other side with respect to the rotation table to provide repelling force to the first magnet part; and a relative movement mechanism which supports the second magnet part and moves the second magnet part relatively close to or away from the first magnet part, where at least one of the first magnet part and the second magnet part is formed in a circular ring shape centering on the rotation axial line as a central axis.

With this substrate processing apparatus, when the second magnet part is moved close to the first magnet part attached on the plate member, the plate member can be held at the second position close to the substrate. In addition, since at least one magnet part of the first magnet part and the second magnet part is formed in a circular ring shape, repelling force is constantly acting between the first and the second magnet parts even when the other magnet part is relatively turning with respect to the one magnet part. With this arrangement, the plate member can be appropriately held at the second position while the plate member is rotating.

Preferably, the substrate processing apparatus further includes a temperature regulating fluid discharge unit which discharges the temperature regulating fluid, where the plate member includes a first skirt part which has a cylindrical shape and is formed to extend in an annular shape, at a position outside of the rotation table, from the base part which extends larger than the rotation table, toward a side of the rotation table, and where the temperature regulating fluid discharge unit discharges the temperature regulating fluid which hit the first skirt part and has dropped.

With this substrate processing apparatus, the temperature regulating fluid moving toward the outside of the plate member by centrifugal force created by the rotation of the plate member is made to hit the first skirt part so that the temperature regulating fluid can be discharged by the temperature regulating fluid discharge unit. With this arrangement, it is possible to prevent or reduce scattering of the temperature regulating fluid to the outside of the plate member.

Preferably, the plate member is provided with an insertion hole through which the substrate holding member is inserted, and extends larger than the substrate held by the substrate holding member.

According to this substrate processing apparatus, the plate member extends larger than the substrate; therefore, the whole of the substrate can be uniformly temperature-regulated. In addition, since the insertion hole, through which the substrate holding member is inserted, is provided in the plate member, it is possible to prevent or reduce interference of the plate member to the substrate holding member.

Preferably, the plate member includes a second skirt part which has a cylindrical shape and extends from the base part toward the rotation table such that the second skirt part forms a hole continuing to the insertion hole, through which the substrate holding member is inserted.

According to this substrate processing apparatus, the second skirt part is provided so as to form the hole continuing to the insertion hole, whereby it is possible to reduce the temperature regulating fluid entering the insertion hole. Therefore, it is possible to reduce the temperature regulating fluid entering between the plate member and the substrate through the insertion hole.

Preferably, the substrate processing apparatus further includes a back-surface-side nozzle between the substrate held by the substrate holding member and the plate member, where the back-surface-side nozzle discharges fluid for back surface processing, the plate member has a through-hole formed at a position overlapping the rotation axial line, and the back-surface-side nozzle is inserted through the through-hole.

According to this substrate processing apparatus, the through-hole is provided at the position of the rotation axis of the plate member, and the back-surface-side nozzle is inserted through the through-hole, whereby the plate member can be rotated with respect to the back-surface side-nozzle, which does not rotate.

Preferably, the plate member includes a third skirt part which has a cylindrical shape and extends from the base part toward the rotation table such that the third skirt part forms a hole continuing to the through-hole, through which the back-surface-side nozzle is inserted.

According to this substrate processing apparatus, the third skirt part is provided so as to form the hole continuing to the through-hole of the plate member, whereby it is possible to reduce the temperature regulating fluid entering the through-hole. Therefore, it is possible to reduce the temperature regulating fluid entering between the plate member and the substrate through the through-hole.

Preferably, the temperature regulating fluid supply unit discharges the temperature regulating fluid, at a position on an outside in a radial direction of the third skirt part of the plate member, outwardly in the radial direction.

According to this substrate processing apparatus, the temperature regulating fluid supply unit discharges, at the position on the outside in the radial direction of the third skirt part of the plate member, temperature regulating fluid toward the outside in the radial direction, whereby it is possible to reduce the temperature regulating fluid entering the inside of the third skirt part and the through-hole.

Preferably, the plate member is made of a material containing silicon or silicon carbide.

According to this substrate processing apparatus, the plate member is configured with silicon or silicon carbide; therefore, the plate member can have high chemical resistance, strength, and thermal conductivity. Further, the plate member can be easily processed thin; therefore, a heat capacity of the plate member can be easily small.

Preferably, the temperature regulating fluid contains helium gas.

According to this substrate processing apparatus, helium gas having a high thermal conductivity is used, whereby the plate member can be well temperature-regulated.

Further, the present invention is directed to a substrate processing method for processing a substrate.

The substrate processing method includes the steps of: (a) holding a substrate by a substrate holding member provided on a surface on one side of a rotation table; (b) rotating, after step (a), a plate member provided between the substrate and the rotation table together with the rotation table, around a predetermined rotation axial line; and (c) supplying, in step (b), between the plate member and the rotation table, a temperature regulating fluid for temperature regulation of the rotating plate member.

According to this substrate processing method, the temperature regulating fluid is supplied between the plate member and the rotation table, whereby the plate member is temperature-regulated. By this operation, the substrate provided on one side of the temperature regulating plate is temperature-regulated. Further, since the plate member also rotates together with the rotation table which rotates the substrate, even if the processing liquid supplied to the rotating substrate is attached to the surface of the plate member, the processing liquid can be moved outwardly by centrifugal force. This arrangement can reduce contamination on the back surface of the substrate.

Preferably, the substrate processing method further includes the step of (d) moving, before step (c), the plate member from a first position on one side of the rotation table to a second position which is closer to the substrate than the first position is.

With this substrate processing method, by disposing the plate member at the second position, which is closer to the substrate than the first position is, the substrate can be effectively temperature-regulated.

Preferably, the substrate processing method further includes the step of (e) moving, after step (d), the plate member from the second position to the first position.

With this substrate processing method, by moving the plate member from the second position to the first position, the plate member can be separated away from the substrate. By this operation, the temperature regulation of the substrate can be quickly stopped; therefore, it is possible to prevent or reduce effect to the process.

Therefore, an object of the present invention is to provide a technology in which the contamination of the substrate is reduced and the substrate is temperature-regulated.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
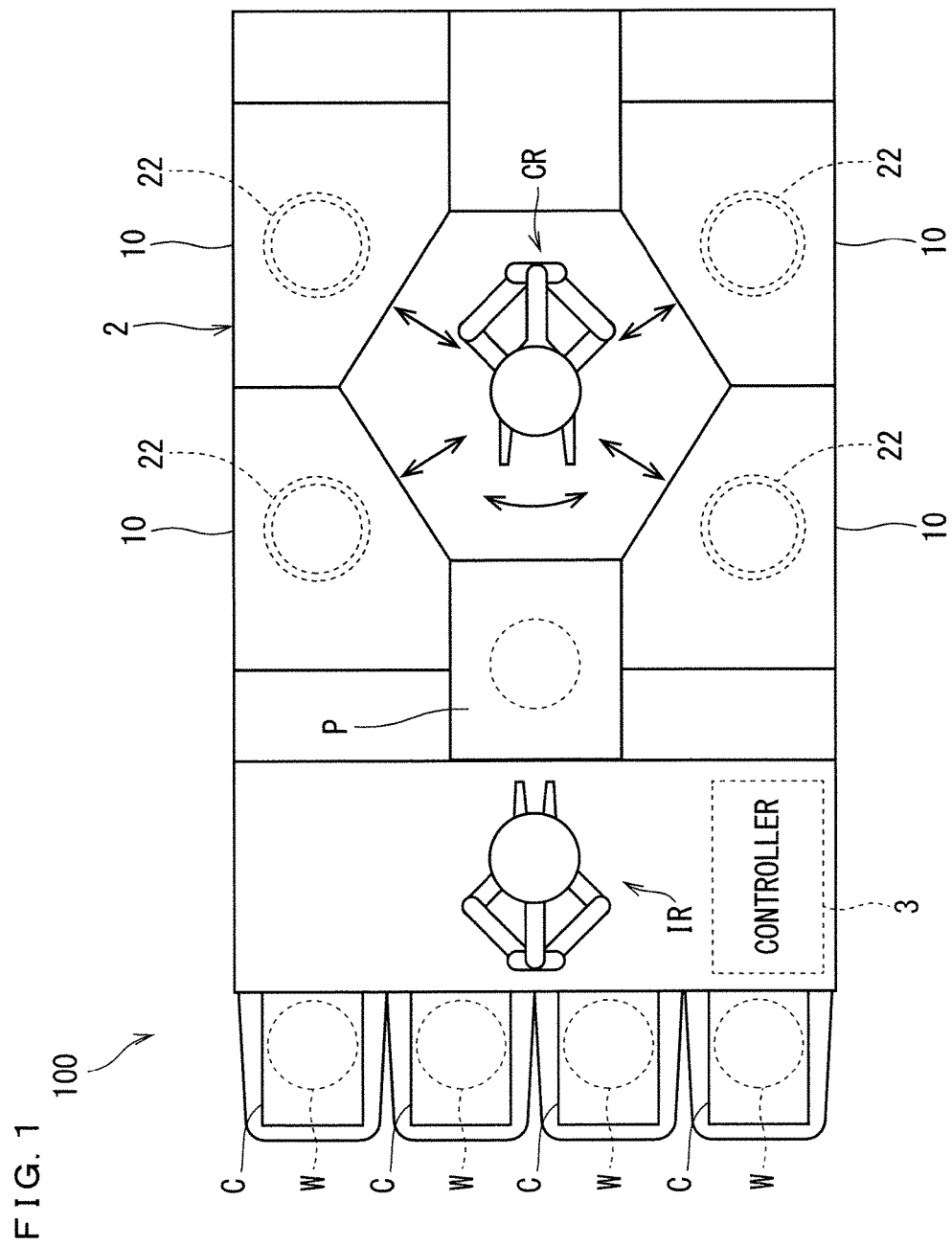
FIG. 1 is a plan view schematically illustrating a configuration of a substrate processing system 100 of a first preferred embodiment.

Hereinafter, preferred embodiments of the present invention will be described with reference to the attached drawings. Note that the components described in the present preferred embodiment are just examples, and it is not intended to limit the scope of the present invention only to the components. In the drawings, the sizes or numbers of the components are illustrated in exaggeration or simplified for easy understanding if needed in some cases. Further, some components are illustrated only by a cross-section for the sake of convenience of illustration in some cases.

1. First Preferred Embodiment

Figure 2:
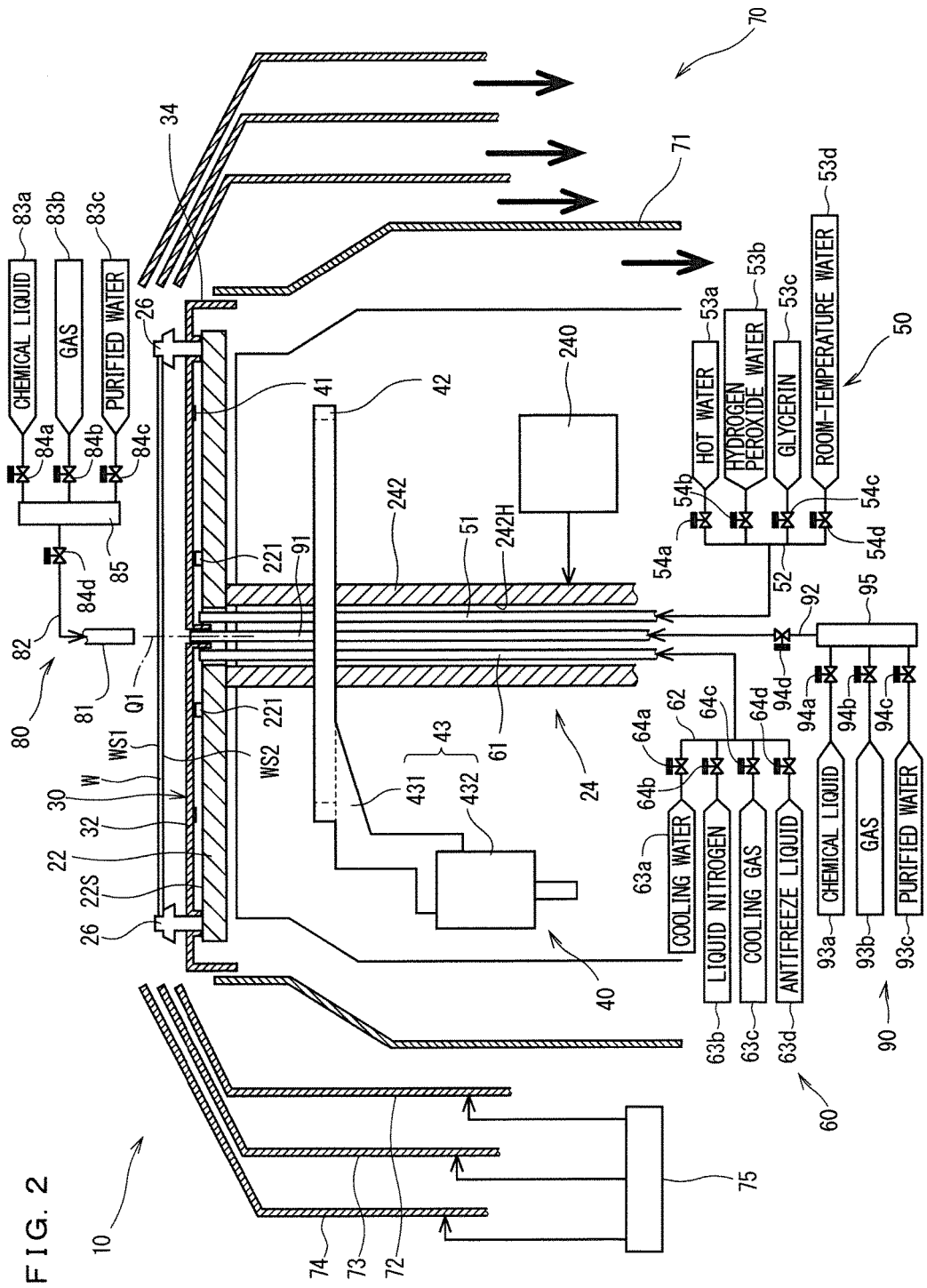
FIG. 2 is a side view schematically illustrating a configuration of a substrate processing apparatus 10 of the first preferred embodiment.
Figure 3:
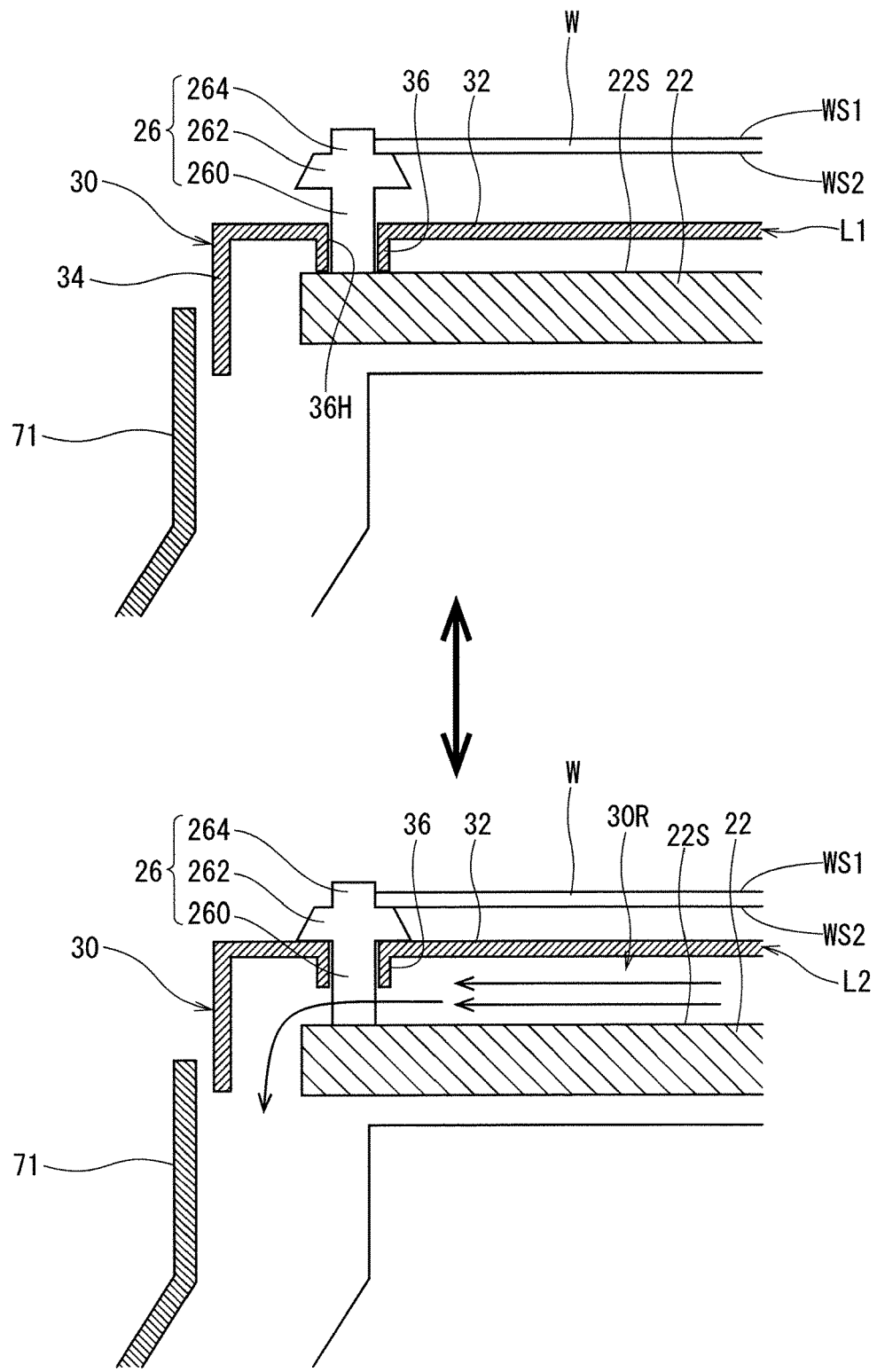
FIG. 3 is a side view schematically illustrating the vicinity of an outer edge of a plate member 30 of the first preferred embodiment.

FIG. 1 is a plan view schematically illustrating a configuration of a substrate processing system 100 of a first preferred embodiment. FIG. 2 is a side view schematically illustrating a configuration of a substrate processing apparatus 10 of the first preferred embodiment. FIG. 3 is a side view schematically illustrating the vicinity of an outer edge of a plate member 30 of the first preferred embodiment. Note that in FIG. 3, the upper column is a diagram illustrating the plate member 30 at a first position L1, and the lower column is a diagram illustrating the plate member 30 at a second position L2.

A substrate processing system 100 illustrated in FIG. 1 is a single-wafer processing system in which a disk-shaped substrate W such as a semiconductor wafer is processed one by one. The substrate processing system 100 is equipped with: a plurality of carriers C in which unprocessed substrates W are stored; and a substrate transfer device (transfer robot) IR which carries the substrate W into and out of each of the carriers C. In addition, the substrate processing system 100 includes a plurality of substrate processing apparatuses 10 which process the substrate W with a processing liquid (including organic solvent) and a processing gas; a conveyance robot CR which carries the substrate W into and out of each of the substrate processing apparatuses 10; and a controller 3 to control operation of a device equipped on the substrate processing system 100 and opening, closing, and the like of a valve.

The transfer robot IR takes out an unprocessed substrate W from one of the carriers C and hands over the taken-out substrate W to the conveyance robot CR, at a substrate transfer position P. Further, the transfer robot IR receives, at the substrate transfer position P, a processed substrate W from the conveyance robot CR and stores the received substrate W in one of the carriers C.

The substrate processing apparatus 10 is a single-wafer type unit in which chemical processing (cleaning processing, etching processing, and the like) using a chemical liquid is performed on a front surface WS1 (pattern-formed surface) and a back surface WS2 of a circular-shaped substrate W. Each of the substrate processing apparatuses 10 performs chemical processing in a box-shaped chamber having an internal space while holding the substrate W in a horizontal posture and rotating the substrate W around a vertical rotation axial line Q1 passing through the center of the substrate W. Hereinafter, in some cases, a description is given simply referring the upper side in the vertical direction as the "upper side" and the lower side in the vertical direction as the "lower side."

As illustrated in FIG. 2, the substrate processing apparatus 10 is equipped with a rotation table 22, a rotation drive unit 24, substrate holding members 26, the plate member 30, a plate member moving mechanism 40, a heating fluid supply unit 50, a cooling fluid supply unit 60, a discharge unit 70, a front-surface-side processing fluid supply unit 80, and a back-surface-side processing fluid supply unit 90.

The rotation table 22 is a member formed in a circular shape when vertically viewed and is configured to rotate around the rotation axial line Q1. The surface 22S on the upper side (the one side) of the rotation table 22 is parallel to the horizontal plane. At the central part of the rotation table 22, there is formed a circular-shaped through-hole 22H which penetrates through in the vertical direction.

The rotation drive unit 24 rotates the rotation table 22 around the rotation axial line Q1. The rotation drive unit 24 has a rotation motor 240 and a rotation shaft part 242. The rotation shaft part 242 is a column-shaped member extending in the vertical direction, and the tip end part thereof is connected to the rotation table 22. The rotation shaft part 242 is rotated around the rotation axial line Q1 by the rotation motor 240. Rotation of the rotation shaft part 242 makes the rotation table 22 rotate around the rotation axial line Q1. The rotation shaft part 242 is a member to transfer a rotational drive force of the rotation motor 240 to the rotation table 22.

At the central part of the rotation shaft part 242, there is formed a hole 242H extending in the vertical direction. The hole 242H continues to the through-hole 22H of the rotation table 22.

The substrate holding members 26 are provided on the surface 22S of the rotation table 22 and hold a substrate W in a horizontal posture at a position upwardly away from the rotation table 22. Note that the expression "horizontal posture" means the state that the main surfaces (the front surface WS1 and the back surface WS2) on the opposite sides of the substrate W are parallel to the horizontal plane. In this example, the four substrate holding members 26 are provided on the front surface of the rotation table 22. The substrate holding members 26 are members which are equidistantly disposed along a circumference having a size corresponding to a substrate W and support the substrate W while being in contact with the circumferential edge part of the substrate W. Note that the number of the substrate holding members 26 is not limited to four. For example, the number of the substrate holding members 26 may be three or less or five or more.

As illustrated in the upper column of FIG. 3, each of the substrate holding members 26 is equipped with a shaft part 260, a wide part 262, and a contact part 264. The shaft part 260 is a part whose base end part is attached on the surface 22S of the rotation table 22 and extends upwardly from the surface 22S. The wide part 262 is a part which is provided on the upper side of the shaft part 260 and made wider in the horizontal direction than the shaft part 260. The contact part 264 is a part which is provided on the upper side of the wide part 262 and whose outer circumferential part is brought in contact with the circumferential edge part of the substrate W. In the present embodiment, the upper surface (the surface on the upper side) of the wide part 262 is in contact with the back surface WS2 of the substrate W; however, this arrangement is not necessary.

<Plate Member 30>

Figure 4:
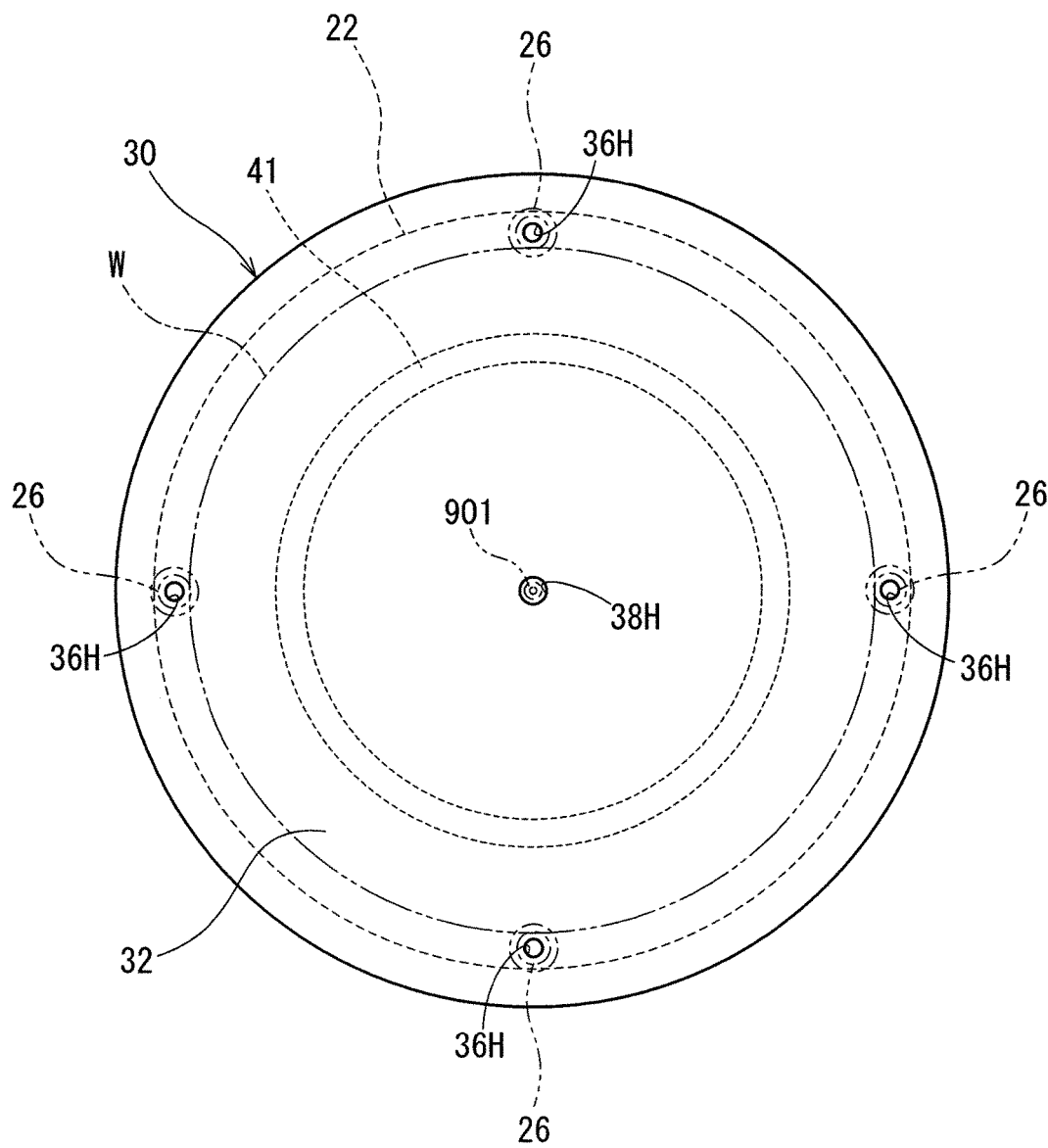
FIG. 4 is a plan view illustrating a front-surface side (upper side) of the plate member 30 of the first preferred embodiment.
Figure 5:
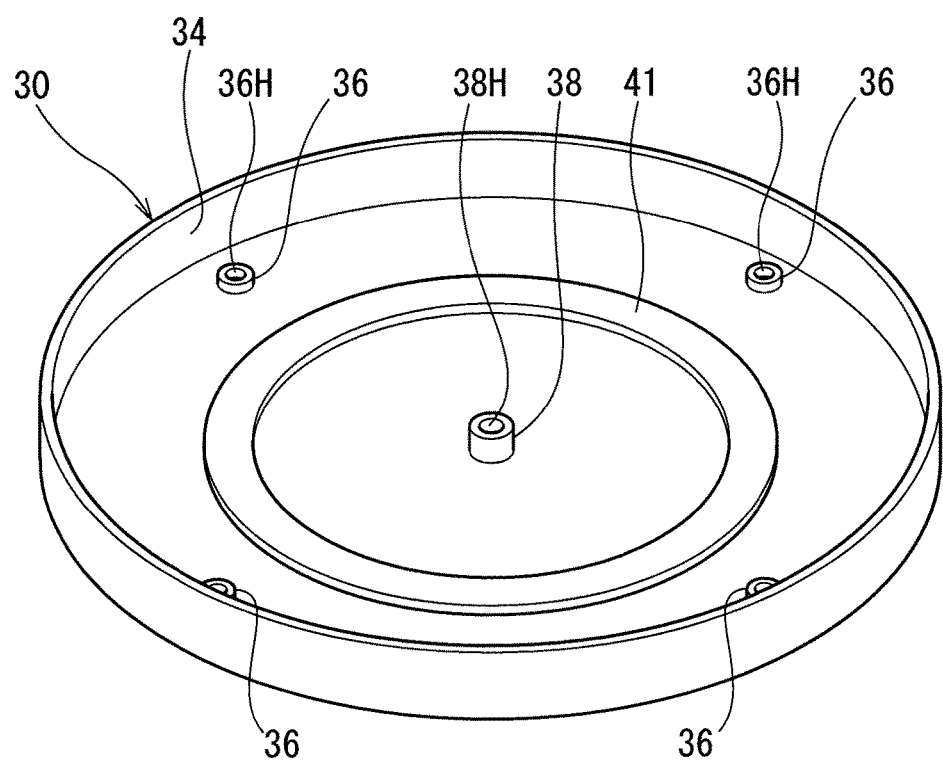
FIG. 5 is a perspective view illustrating a back-surface side (lower side) of the plate member 30 of the first preferred embodiment.

FIG. 4 is a plan view illustrating a front-surface side (upper side) of the plate member 30 of the first preferred embodiment. FIG. 5 is a perspective view illustrating a back-surface side (lower side) of the plate member 30 of the first preferred embodiment.

The plate member 30 has a base part 32 which is formed in a disk shape and faces the surface 22S of the rotation table 22. The base part 32 is rotated by the rotation drive unit 24 together with the rotation table 22 while being disposed between the substrate W supported by the substrate holding members 26 and the rotation table 22.

The base part 32 extends in a horizontal direction larger than the rotation table 22. On the lower side of the circumferential edge part of the base part 32, there is provided a first skirt part 34. The first skirt part 34 is a cylindrical part which is formed in an annular shape downwardly extending in the vertical direction (toward the side of the rotation table 22) from the base part 32 at a position outside, in a horizontal direction (the direction parallel to the surface 22S of the rotation table 22) of the rotation table 22.

As described later, between the rotation table 22 and the plate member 30, a temperature regulating fluid is supplied from the heating fluid supply unit 50 or the cooling fluid supply unit 60. The temperature regulating fluid is moved outwardly in the radial direction, being affected by a centrifugal force created by the rotation of the rotation table 22 and the plate member 30. The first skirt part 34 receives the temperature regulating fluid having scattered to the outside of the rotation table 22 and leads the temperature regulating fluid to the discharge unit 70.

In the base part 32 of the plate member 30, there are formed insertion holes 36H, and each of the four substrate holding members 26 is inserted through each of the insertion holes 36H. In this embodiment, the four insertion holes 36H are equidistantly arranged along a circumference centering the rotation axial line Q1. As illustrated in FIG. 3, the shaft part 260 of each of the substrate holding members 26 is inserted through each of the insertion holes 36H. The inner diameter of each of the insertion holes 36H is slightly larger than the shaft part 260.

On the lower side of the base part 32, there are formed cylindrically-shaped second skirt parts 36 each of which forms a hole continuing to each of the insertion holes 36H. Each of the second skirt parts 36 is formed in an annular shape extending from the base part 32 downwardly in the vertical direction toward the rotation table 22. Each of the inner peripheral surfaces of the second skirt parts 36 is formed in such an annular shape that fits the outer circumferential surface of each of the shaft parts 260.

The second skirt parts 36 prevent or reduce the temperature regulating fluid entering the insertion holes 36H by bouncing back the temperature regulating fluid moving outwardly in the radial direction of the rotation table 22.

Further, when the rotation table 22 rotates around the rotation axial line Q1, the substrate holding members 26 also rotate around the rotation axial line Q1. With this movement, the inner peripheral surfaces of the insertion holes 36H of the plate member 30 receives rotational force from the substrate holding members 26 inserted into the insertion holes 36H, whereby the plate member 30 rotates together with the rotation table 22 at the same rotation speed and in the same rotational direction.

As illustrated in FIG. 5, a through-hole 38H is formed at the central part of a surface 32S of the base part 32 of the plate member 30. In the through-hole 38H, there is inserted a back-surface-side nozzle 91 of the back-surface-side processing fluid supply unit 90. Through the through-hole 38H, the back-surface-side nozzle 91 supplies a processing fluid for back surface processing between the substrate W and the plate member 30. By this operation, the back surface WS2 of the substrate W is processed with the processing fluid.

On the lower side of the base part 32, there is formed a cylindrically-shaped third skirt part 38 which forms a hole continuing to the through-hole 38H. The third skirt part 38 is formed in an annular shape extending from the base part 32 downwardly in the vertical direction toward the rotation table 22. The tip end part of the third skirt part 38 is disposed between the tip end part of a heating nozzle 51 of the heating fluid supply unit 50 and the tip end part of the back-surface-side nozzle 91. Further, the tip end part of the third skirt part 38 is disposed between the tip end part of a cooling nozzle 61 of the cooling fluid supply unit 60 and the tip end part of the back-surface-side nozzle 91.

The plate member 30 can be made of a material containing silicon (Si) or silicon carbide (SiC). When the plate member 30 is formed of silicon or silicon carbide, the plate member 30 can have high chemical resistance, strength, and thermal conductivity. In addition, the plate member 30 can be easily processed thin; therefore, a heat capacity of the plate member 30 can be easily small. However, the constituent material of the plate member 30 is not limited to silicon or silicon carbide.

<Plate Member Moving Mechanism 40>

The plate member moving mechanism 40 is a lift mechanism which moves the plate member 30 up and down in the vertical direction. The plate member moving mechanism 40 moves the plate member 30 between (i) the first position L1 which is above the rotation table 22 and (ii) the second position L2 which is closer to the back surface WS2 of the substrate W held by the substrate holding members 26 than the first position L1 is.

The plate member moving mechanism 40 is equipped with a first magnet part 41, a second magnet part 42, and a relative movement mechanism 43.

As illustrated in FIG. 5, the first magnet part 41 is provided on the lower side of the base part 32 of the plate member 30. In this embodiment, the first magnet part 41 is formed in an annular shape (a circular ring shape, in this embodiment) with the rotation axial line Q1 as a central axis.

The second magnet part 42 is formed in an annular shape (a circular ring shape, in this embodiment) with the rotation axial line Q1 as a central axis as illustrated in FIG. 2. The second magnet part 42 is disposed at such a position that the second magnet part 42 is opposed, in the vertical direction, to the first magnet part 41 with the rotation table 22 therebetween. The second magnet part 42 creates repelling force to the first magnet part 41.

Inside the second magnet part 42, the rotation shaft part 242 is inserted. Therefore, the second magnet part 42 can be moved up and down in the vertical direction without interfering the rotation shaft part 242.

The relative movement mechanism 43 is equipped with a support part 431 and a drive unit 432. On the lateral side of the rotation shaft part 242, the support part 431 supports the second magnet part 42 from below. The drive unit 432 is connected to the support part 431 and vertically moves up and down the support part 431. When the drive unit 432 moves up and down the support part 431, the second magnet part 42 gets relatively close to and away from the first magnet part 41. The second magnet part 42 is selectively positioned at the above-described first position L1 or second position L2 by the operation of the relative movement mechanism 43. The drive unit 432 is preferably configured with, for example, a linear motor or a rotation motor for driving a ball screw. The operation of the drive unit 432 is controlled by the controller 3.

The first magnet part 41 and the second magnet part 42 are formed in a coaxial circular ring shape with the rotation axial line Q1 as a central axis. Thus, while the first magnet part 41 is relatively rotating with respect to the second magnet part 42 due to the rotation of the plate member 30, repelling force can be acting between the magnet parts.

Note that any one magnet part of the first magnet part 41 and the second magnet part 42 may be a plurality of magnets dispersedly arranged on the circumference of a circle concentric to the annular shape of the other magnet part. In this case, the one magnet part configured with the plurality of magnets relatively rotates with respect to the other annular magnet part. With this arrangement, the other magnet part can make repelling force constantly act on the one magnet part. Therefore, the plate member 30 can be appropriately held at the second position L2 while the plate member 30 is rotating.

Figure 6:
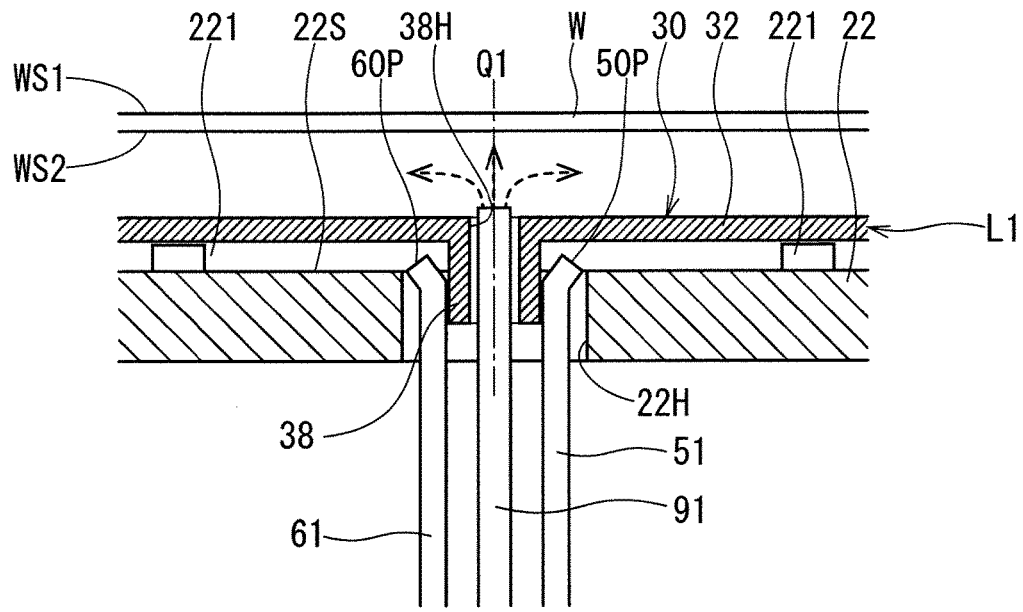
FIG. 6 is a side view schematically illustrating the vicinity of the center of the plate member 30.
Figure 6:
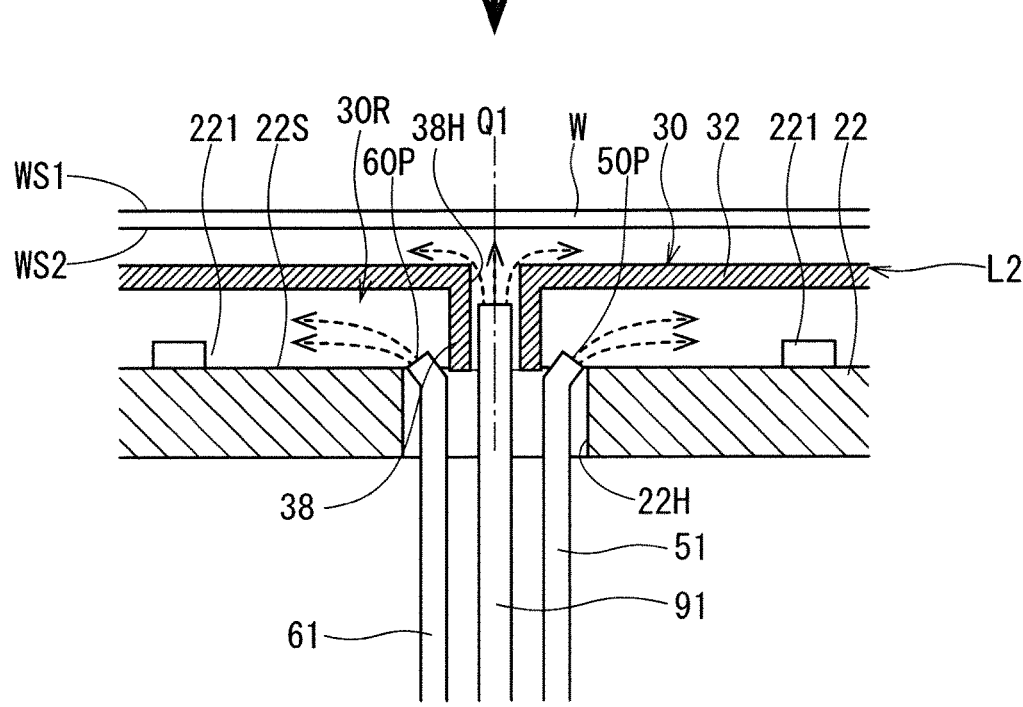

The first position L1 is the position, in the vertical direction, of the plate member 30 when the base part 32 of the plate member 30 gets closest to the surface 22S of the rotation table 22 (FIG. 2). In this embodiment, when the plate member 30 is at the first position L1, the lower end of the second skirt parts 36 is in contact with the surface 22S of the rotation table 22 (the upper column of FIG. 3). Further, when the plate member 30 is at the first position L1, the base part 32 of the plate member 30 is supported by a plurality of support members 221 provided on the surface 22S of the rotation table 22 (FIG. 2 and FIG. 6). Therefore, when the plate member 30 is at the first position L1, the base part 32 of the plate member 30 is disposed at a position apart from the surface 22S of the rotation table 22.

Note that the support members 221 do not need to be provided and can be omitted. In this case, only the lower ends of the second skirt parts 36 are in contact with the rotation table 22, whereby the plate member 30 is supported at the first position L1. Alternatively, the second skirt parts 36 do not need to be in contact with the rotation table 22. That is, only the support members 221 may be in contact with the base part 32 so as to support the plate member 30 at the first position L1.

The first position L1 is the position at which the plate member 30 is disposed, for example, when the substrate W is not temperature-regulated in the substrate processing apparatus 10. However, it is possible to supply a temperature regulating fluid to temperature-regulate the substrate W while the plate member 30 is being disposed at the first position L1. In this case, since the plate member 30 is disposed at a position away from the substrate W, the substrate W can be gently temperature-regulated.

When the relative movement mechanism 43 moves the second magnet part 42 close to the first magnet part 41, the plate member 30 is moved upwardly from the first position L1. Then, the plate member 30 comes in contact with the lower surface of the wide part 262 of the substrate holding members 26, and the upward movement of the plate member 30 is then restricted (the lower column of FIG. 3). Since the substrate holding members 26 function as stoppers as described above, the upward movement of the plate member 30 is stopped. The position at which the plate member 30 is stopped corresponds to the second position L2.

When the plate member 30 is moved to the second position L2, there is thus formed between the base part 32 of the plate member 30 and the rotation table 22 a temperature regulating space 30R to which a temperature regulating fluid is supplied. By the temperature regulating fluid (a heating fluid or a cooling fluid) being supplied to the temperature regulating space 30R, the temperature of the plate member 30 can be changed to the temperature corresponding to the temperature of the temperature regulating fluid. With this arrangement, the substrate W can be temperature-regulated from below. As described above, substrate processing can be performed along with temperature regulation in the substrate processing apparatus 10.

As illustrated in the lower column of FIG. 3, the length of the first skirt part 34 in the vertical direction is set such that the lower end of the first skirt part 34 of the plate member 30 disposed at the second position L2 is positioned lower than the surface 22S of the rotation table 22. This arrangement reduces the temperature regulating fluid scattering to the outside of the first skirt part 34.

Note that the plate member moving mechanism 40 can be omitted. For example, the plate member 30 may be moved to an appropriate height position with respect to the rotation table 22 by increasing and decreasing the flow rate per unit time of the temperature regulating fluid supplied by the heating fluid supply unit 50 or the cooling fluid supply unit 60.

<Heating Fluid Supply Unit 50>

The heating fluid supply unit 50 heats the plate member 30 by supplying a high-temperature fluid between the rotating rotation table 22 and plate member 30, and consequently heats the substrate W. The heating fluid supply unit 50 is equipped with the heating nozzle 51, a pipe part 52, fluid supply sources 53a to 53d, and valves 54a to 54d.

FIG. 6 is a side view schematically illustrating the vicinity of the center of the plate member 30. Note that in FIG. 6, the upper column is a diagram illustrating the plate member 30 at the first position L1, and the lower column is a diagram illustrating the plate member 30 at the second position L2. The heating nozzle 51 discharges the heating fluid supplied from each of the fluid supply sources 53a to 53d, from a discharge port 50P on the tip end of the heating nozzle 51.

As illustrated in FIG. 6, the discharge port 50P is disposed higher than the surface 22S of the rotation table 22. Further, the discharge port 50P is disposed at a position on the outside, in the radial direction, of the third skirt part 38 of the plate member 30. Further, the discharge port 50P is opened in the direction inclined, outwardly in the radial direction of the plate member 30, with respect to the vertical direction. With this arrangement, as illustrated in the lower column of FIG. 6, the heating fluid is discharged from the discharge port 50P, at a position on the outside, in the radial direction, of the third skirt part 38 of the plate member 30, while being accelerated outwardly in the radial direction. Since the heating fluid is discharged outwardly in the radial direction, it is possible to reduce the heating fluid entering the inside of the third skirt part 38 and into the through-hole 38H. Note that the discharge port 50P may be directed upwardly in the vertical direction.

The pipe part 52 connects each of the fluid supply sources 53a to 53d and the heating nozzle 51 and forms a flow passage which leads the fluid supplied from each of the fluid supply sources 53a to 53d to the heating nozzle 51.

In this embodiment, each of the fluid supply sources 53a to 53c of the fluid supply sources 53a to 53d is configured as a supply source for supplying each of hot water (purified water such as deionized water), SPM (sulfuric acid/hydrogen peroxide mixture), and glycerin, and the fluid supply source 53d is configured as a supply source for supplying a room-temperature water (purified water such as deionized water). Since SPM or glycerin has a higher boiling point than water and can be heated up to a higher temperature (for example, 100° C. or higher) than water. When the substrate W is heat-treated at a high temperature of 100° C. or higher, is rapidly heated, or is subjected to other treatments, high-temperature SPM, glycerin, or other liquids can be supplied to the temperature regulating space 30R. A room-temperature water can be used for removing the high-temperature heating fluid supplied to the temperature regulating space 30R. It is preferable that each of the fluid supply sources 53a to 53d be appropriately equipped with a tank to store a heating fluid and liquid feeding means such as a pump to send the heating fluid from the tank.

Note that the heating fluid supply unit 50 may be configured to be able to supply a part of the hot water, the SPM, and the glycerin or may be configured to be able to supply other fluids (liquid or gas) than these heating fluids. For example, steam (water vapor at 200° C., for example) can be employed as a heating gas.

Each of the valves 54a to 54d is inserted midway in each part of the pipe part 52 extending from the fluid supply sources 53a to 53d. Each of the valves 54a to 54d controls discharge, from the discharge port 50P, of the heating fluid supplied from each of the fluid supply sources 53a to 53d by opening/closing the flow passage of the pipe part 52. The operations of the valves 54a to 54d can be controlled by the controller 3.

<Cooling Fluid Supply Unit 60>

The cooling fluid supply unit 60 cools the plate member 30 by supplying a low-temperature fluid between the rotation table 22 and plate member 30, and consequently cools the substrate W. The cooling fluid supply unit 60 is equipped with the cooling nozzle 61, a pipe part 62, fluid supply sources 63a to 63d, and valves 64a to 64d.

The cooling nozzle 61 discharges the cooling fluid supplied from each of the fluid supply sources 63a to 63d, from a discharge port 60P on the tip end of the cooling nozzle 61. As illustrated in FIG. 6, the discharge port 60P of the cooling nozzle 61 is disposed at a position higher than the surface 22S of the rotation table 22, similarly to the discharge port 50P of the heating nozzle 51. Further, the discharge port 60P is disposed at a position on the outside, in the radial direction, of the third skirt part 38 of the plate member 30. Further, the discharge port 60P is opened in the direction inclined, outwardly in the radial direction of the plate member 30, with respect to the vertical direction. With this arrangement, as illustrated in the lower column of FIG. 6, the cooling fluid is discharged from the discharge port 60P, while being accelerated outwardly in the radial direction of the plate member 30. Since the cooling fluid is discharged outwardly in the radial direction, it is possible to reduce the cooling fluid entering the inside of the third skirt part 38 and into the through-hole 38H. Note that the discharge port 60P may be directed upwardly in the vertical direction.

As illustrated in FIG. 6, when the plate member 30 has moved to the first position L1, the lower surface of the base part 32 of the plate member 30 is supported by the support members 221 and is thus disposed upwardly away from the tip end of the heating nozzle 51 or the cooling nozzle 61. With this arrangement, the plate member 30 is held at the first position L1 at which the plate member 30 is not in contact with any of the tip ends of the heating nozzle 51 and the cooling nozzle 61.

The pipe part 62 connects each of the fluid supply sources 63a to 63d and the cooling nozzle 61 and forms a flow passage which leads the cooling fluid supplied from each of the fluid supply sources 63a to 63d to the cooling nozzle 61.

In this embodiment, each of the fluid supply sources 63a to 63d is configured as a supply source for supplying each of cooling water (cooled deionized water or the like), liquid nitrogen, cooling gas (helium gas or the like), and antifreeze liquid (liquid containing glycerin or the like). Note that helium gas has a high thermal conductivity and can therefore temperature-regulate the substrate W well when used as a cooling fluid. Further, helium gas can be used also as a heating fluid.

The cooling fluid supply unit 60 may be configured to be able to supply part of cooling water, liquid nitrogen, cooling gas, and antifreeze liquid or may be configured to be able to supply other fluids (liquid or gas) than these cooling fluids.

It is preferable that, in order to supply liquid as a cooling fluid, each of the fluid supply sources 63a, 63b, and 63d be appropriately equipped with a tank to store the cooling fluid and liquid feeding means such as a pump to send a cooling fluid from the tank. Further, it is preferable that, in order to supply gas as a cooling fluid, the fluid supply source 63c be appropriately equipped with a bomb or the like to store a cooling fluid which is highly pressurized due to compression.

The valves 64a to 64d are respectively inserted midway in each part of the pipe part 62 extending from the fluid supply sources 63a to 63d. Each of the valves 64a to 64d controls discharge, from the discharge port 60P, of the cooling fluid supplied from each of the fluid supply sources 63a to 63d by opening/closing the flow passage of the pipe part 62. The operations of the valves 64a to 64d can be controlled by the controller 3.

Note that the substrate processing apparatus 10 does not have to be equipped with both of the heating fluid supply unit 50 and the cooling fluid supply unit 60 as a temperature regulating fluid supply unit and may be equipped with only either one of the two.

It is possible to arbitrarily set the discharge flow rate at which the temperature regulating fluid is discharged from the discharge port 50P or the discharge port 60P. For example, the temperature regulating fluid may be discharged at such a discharge flow rate that the temperature regulating space 30R can be substantially fully filled with the temperature regulating fluid. Alternatively, the temperature regulating fluid may be discharged at such a discharge flow rate that the temperature regulating fluid moves along the back surface of the base part 32 of the plate member 30. Specifically, the temperature regulating fluid is preferably made to hit the back surface of the base part 32 of the rotating plate member 30 so that the temperature regulating fluid is moved outwardly in the radial direction of the base part 32 by the centrifugal force. If the rotation speed of the plate member 30, the discharge flow rate of the temperature regulating fluid, and the like are appropriately adjusted, the temperature regulating fluid can be moved outwardly in the radial direction of the base part 32 almost without falling on the surface 22S of the rotation table 22. In this case, since the temperature regulating fluid is moved in contact with the plate member 30, the plate member 30 itself is temperature-regulated, and less temperature regulating fluid is used than in the case where the temperature regulating space 30R is fully filled with the temperature regulating fluid.

<Discharge Unit 70>

The discharge unit 70 discharges, from the substrate processing apparatus 10, (i) the temperature regulating fluid supplied between the rotating rotation table 22 and plate member 30, (ii) the processing fluid supplied to the front surface WS1 of the rotating substrate W (hereinafter, also referred to as a "front-surface-side processing fluid"), and (iii) the processing fluid supplied to the back surface WS2 of the rotating substrate W (hereinafter, also referred to as a "back-surface-side processing fluid"). The discharge unit 70 is equipped with a first cup 71 to a fourth cup 74 and a cup moving mechanism unit 75.

The first cup 71 is a member formed in a cylindrical shape which surrounds the rotation table 22. The first cup 71 leads the temperature regulating fluid, which has fallen after hitting the first skirt part 34 of the plate member 30, to a discharge outlet (not shown) provided on the inside of the first cup 71. The upper end of the first cup 71 is disposed higher than the lower end of the first skirt part 34 of the plate member 30, which is moved up to the second position L2 (see the lower column of FIG. 3). With this arrangement, it is possible to prevent or reduce scattering, to the outside of the first cup 71, of the temperature regulating fluid having scattered to the outside of the first skirt part 34. The discharge outlet formed inside the first cup 71 is an example of the temperature regulating fluid discharge unit. Note that, in the case where gas is used as a temperature regulating fluid, suctioning means such as a vacuum pump may be provided at an appropriate position so as to suction the gas (temperature regulating fluid) through the discharge outlet inside the first cup 71.

The second cup 72 to the fourth cup 74 are members formed in a cylindrical shape surrounding the rotation table 22. The second cup 72 is disposed on the outside of the first cup 71, the third cup 73 is disposed on the outside of the second cup 72, and the fourth cup 74 is on the outside of the third cup 73. The second cup 72 to the fourth cup 74 receive the processing liquid which was supplied to the front surface WS1 or the back surface WS2 of the substrate W and then scattered to the outside, in the radial direction, of the substrate W, and the second cup 72 to the fourth cup 74 lead the received processing liquid to discharge outlets (not shown) each provided under each of the cups 72 to 74. The cup moving mechanism unit 75 independently moves up and down each of the second cup 72 to the fourth cup 74. The cup moving mechanism unit 75 changes the height positions of the second cup 72 to the fourth cup 74 so as to choose one of the second cup 72 to the fourth cup 74, and the chosen cup receives the processing liquid having scattered to the outside of the substrate W.

<Front-Surface-Side Processing Fluid Supply Unit 80>

The front-surface-side processing fluid supply unit 80 supplies a processing fluid to the front surface WS1 of the rotating substrate W so as to process the front surface WS1. The front-surface-side processing fluid supply unit 80 is equipped with a front-surface-side nozzle 81, a pipe part 82, processing-fluid supply sources 83a to 83c, valves 84a to 84d, and a mixing unit 85.

The front-surface-side nozzle 81 discharges the processing fluid toward the front surface WS1 of the substrate W. In this embodiment, the front-surface-side nozzle 81 discharges the processing fluid toward the vicinity of the center of the rotating substrate W held by the substrate holding members 26. Note that the front-surface-side nozzle 81 is attached to the tip end of an arm (not shown). When a movement driving unit (not shown) moves the arm in a horizontal plane (in a circular movement, linear movement, or the like), the front-surface-side nozzle 81 is moved between a supply position (the position illustrated in FIG. 2 or the like) at which the front-surface-side nozzle 81 supplies the processing fluid to the substrate W and a retreat position to which the front-surface-side nozzle 81 is retreated outwardly in the radial direction from the position above the rotation table 22. When the front-surface-side nozzle 81 is at the retreat position, the substrate W is carried onto the rotation table 22 or carried out from the rotation table 22.

The pipe part 82 connects between each of the processing-fluid supply sources 83a to 83c and the mixing unit 85 and between the mixing unit 85 and the front-surface-side nozzle 81, and the pipe part 82 forms flow passage which leads the processing fluid supplied from each of the processing-fluid supply sources 83a to 83c to the front-surface-side nozzle 81.

In this embodiment, the processing-fluid supply sources 83a to 83c are configured as supply sources which supply chemical liquid, gas, and purified water. Note that the chemical liquid is, for example, IPA (Isopropyl Alcohol), DHF (Diluted Hydrofluoric acid), SC-1 (mixed liquid of hydrogen peroxide water and ammonia), and the like. Further, the gas is, for example, inert gas ($N_2$, Ar, He, Kr, Xe, or mixed gas of these).

The valves 84a to 84c are each inserted into each part of the pipe part 82 connecting between the processing-fluid supply sources 83a to 83c and the mixing unit 85. Each of the valves 84a to 84c controls supply of the processing fluid from each of the processing-fluid supply sources 83a to 83c to the mixing unit 85 by opening/closing of the flow passage in the pipe part 82.

The valve 84d is inserted into the pipe part 82 from the mixing unit 85 to the front-surface-side nozzle 81. The valve 84d controls supply of the processing fluid from the mixing unit 85 to the front-surface-side nozzle 81 by opening/closing the flow passage in the pipe part 82. The opening/closing operation of the pipe part 82 by the valves 84a to 84d can be controlled by the controller 3.

The mixing unit 85 has an internal space elongated in the vertical direction, and the processing fluids supplied from the processing-fluid supply sources 83a to 83c are mixed in the internal space. The processing fluids mixed in the mixing unit 85 are supplied to the front-surface-side nozzle 81 through the pipe part 82.

<Back-Surface-Side Processing Fluid Supply Unit 90>

The back-surface-side processing fluid supply unit 90 supplies a processing fluid to the back surface WS2 of the rotating substrate W so as to process the back surface WS2. The back-surface-side processing fluid supply unit 90 is equipped with a back-surface-side nozzle 91, a pipe part 92, processing-fluid supply sources 93a to 93c, valves 94a to 94d, and a mixing unit 95.

The back-surface-side nozzle 91 discharges the processing fluid toward the back surface WS2 of the substrate W. The back-surface-side nozzle 91 is inserted into the through-hole 22H of the rotation shaft part 242 of the rotation table 22 and into the inside of the plate member 30, and further inserted into the through-hole 38H formed at the central part of the plate member 30. The back-surface-side nozzle 91 discharges the processing fluid toward the back surface WS2 of the substrate W from the discharge port on the tip end.

The pipe part 92 connects between each of the processing-fluid supply sources 93a to 93c and the mixing unit 95 and between the mixing unit 95 and the back-surface-side nozzle 91, and the pipe part 92 forms a flow passage which leads the processing fluid supplied from each of the processing-fluid supply sources 93a to 93c to the back-surface-side nozzle 91.

In this embodiment, the processing-fluid supply sources 93a to 93c are configured as supply sources which supply chemical liquid, gas, and purified water. Note that the chemical liquid is, for example, IPA, DHF, SC-1, and the like. Further, the gas is, for example, inert gas ($N_2$, Ar, He, Kr, Xe, or mixed gas of these).

The valves 94a to 94c are each inserted into each part of the pipe part 92 connecting between the processing-fluid supply sources 93a to 93c and the mixing unit 95. Each of the valve 94a to 94c controls supply of the processing fluid from each of the processing-fluid supply sources 93a to 93c to the mixing unit 95 by opening/closing of the flow passage in the pipe part 92.

The valve 94d is inserted into the pipe part 92 from the mixing unit 95 to the back-surface-side nozzle 91. The valve 94d controls supply of the processing fluid from the mixing unit 95 to the back-surface-side nozzle 91 by opening/closing the flow passage in the pipe part 92. The opening/closing operation of the pipe part 92 by the valves 94a to 94d can be controlled by the controller 3.

The mixing unit 95 has an internal space elongated in the vertical direction, and the processing fluids supplied from the processing-fluid supply sources 93a to 93c are mixed in the internal space. The processing fluids mixed in the mixing unit 95 are supplied to the back-surface-side nozzle 91 through the pipe part 92.

<Operation of the Substrate Processing Apparatus 10>

Next, an example of an operation of the substrate processing apparatus 10 will be described with reference to FIG. 7 to FIG. 12. FIG. 7 to FIG. 12 are schematic sectional views of the substrate processing apparatus 10 of the first preferred embodiment. Note that the operation of the substrate processing apparatus 10 described below is performed under the control of the controller 3 unless otherwise mentioned.

In this embodiment, as an example of substrate processing, an example is described in which oxide film etching is performed to remove an oxide film formed on a front surface WS1 (the surface on which a device is to be formed) of a substrate W having a predetermined size (for example, outer diameter of 300 mm).

Figure 7:
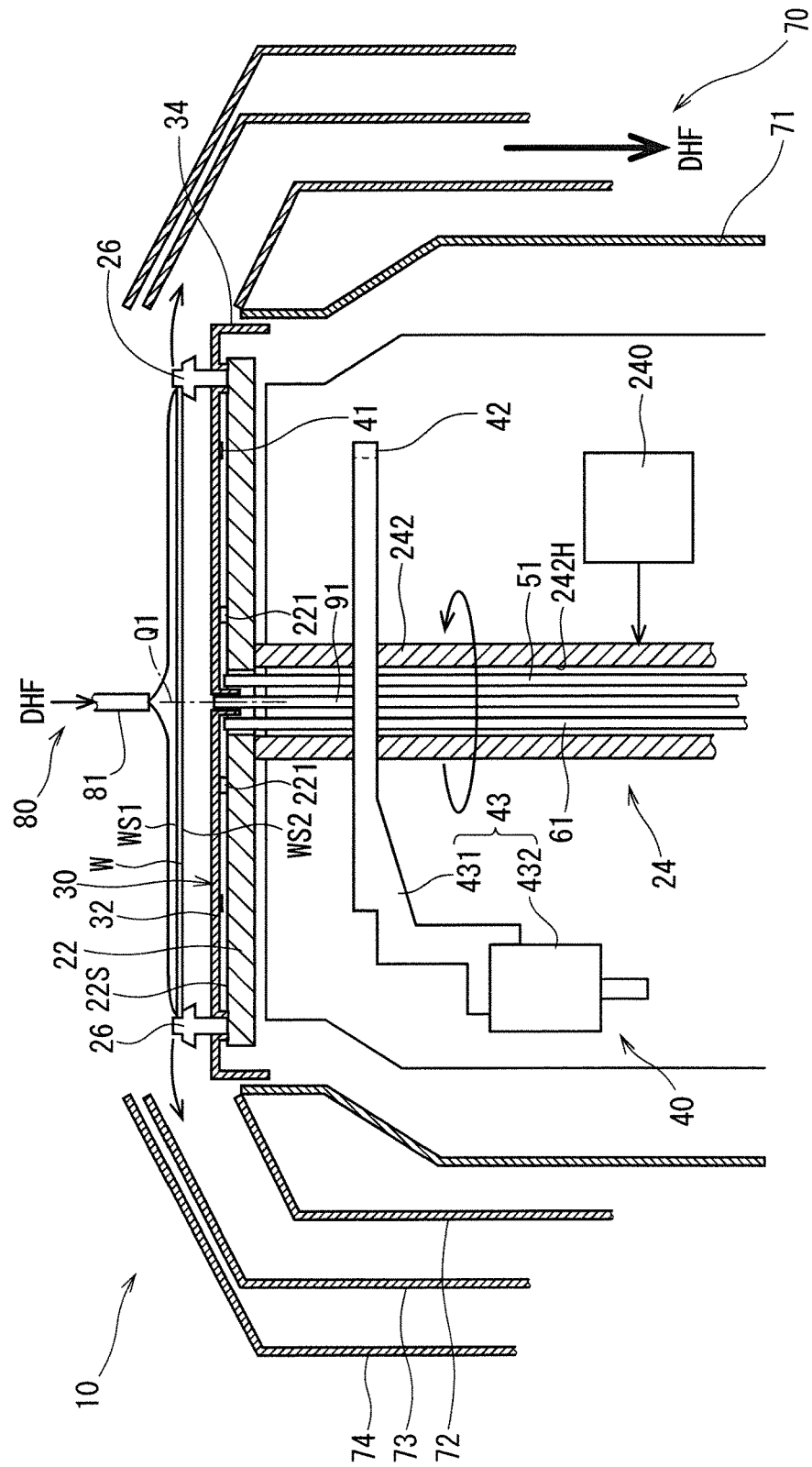
FIGS. 7, 8, 9, 10, 11, and 12 are schematic sectional views of the substrate processing apparatus 10 of the first preferred embodiment.

First, an unprocessed substrate W is carried into the substrate processing apparatus 10 and is then held by the substrate holding members 26 (holding step). Subsequently, as illustrated in FIG. 7, DHF is discharged to the front surface WS1 from the front-surface-side nozzle 81 while the substrate W is rotated by the rotation of the rotation table 22 (for example, 600 to 1200 rpm). The discharged DHF is spread by the centrifugal force, and the entire front surface WS1 is thus coated with a liquid film of DHF (DHF coating step). Note that the DHF scattering to the lateral side of the substrate W is received by the third cup 73 and is discharged. The plate member 30 is rotated together with the rotation table 22 while being disposed at the first position L1 (rotation step).

After a predetermined time has elapsed and when the entire front surface WS1 of the substrate W has been coated with the liquid film of DHF, a DHF paddling step is performed to form and hold a paddle-like liquid film on the front surface WS1 of the substrate W. Specifically, the rotation speed of the substrate W is reduced in a short period of time to a rotation speed (for example, approximately 10 rpm) which is slower than the rotation speed in the DHF coating step. Hereinafter, this rotation speed is a paddle speed. Note that the discharge flow rate of DHF from the front-surface-side nozzle 81 is kept the same as the discharge flow rate (for example, 2.0 liters per minute) in the DHF coating step. Due to the reduction in the rotation speed of the substrate W, the DHF is accumulated on the front surface WS1 to form a paddle-like liquid film. This paddle-like liquid film chemically processes the entire front surface WS1 of the substrate W.

Figure 8:
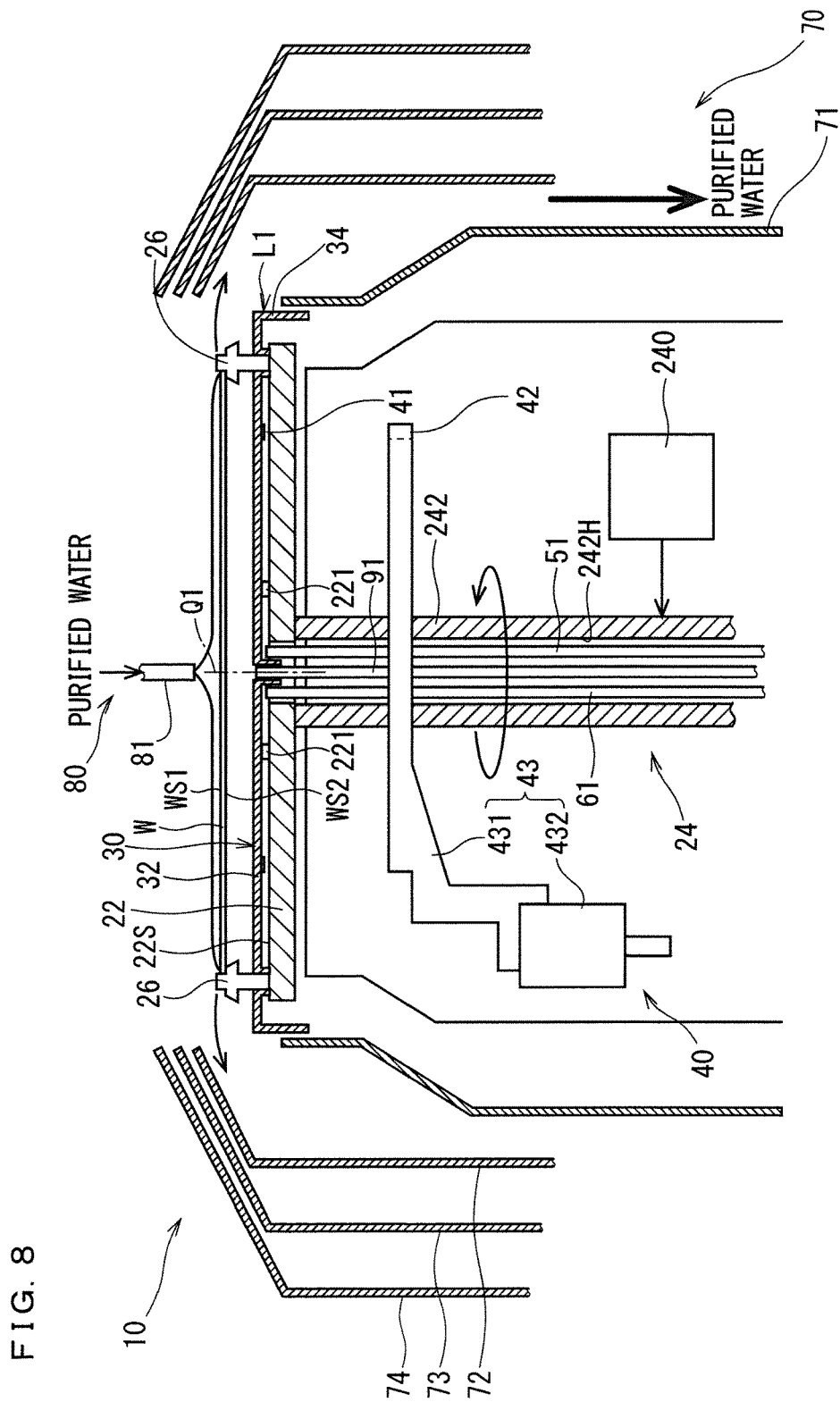

When a predetermined process time has elapsed since the start of the discharge of DHF, the discharge of DHF from the front-surface-side nozzle 81 is stopped, and a paddle rinsing step is performed to replace the DHF on the substrate W with a rinsing liquid (purified water). Specifically, as illustrated in FIG. 8, purified water is discharged at a predetermined discharge flow rate from the front-surface-side nozzle 81 to the front surface WS1 of the substrate W while keeping the rotation speed of the substrate W at the rotation speed in the DHF paddling step. Then, when a predetermined time has elapsed, the DHF has been replaced with a paddle-like purified water liquid film, on the entire front surface WS1 of the substrate W. The purified water flowing to the lateral side of the substrate W is received by the first cup 71 and is discharged.

Figure 9:
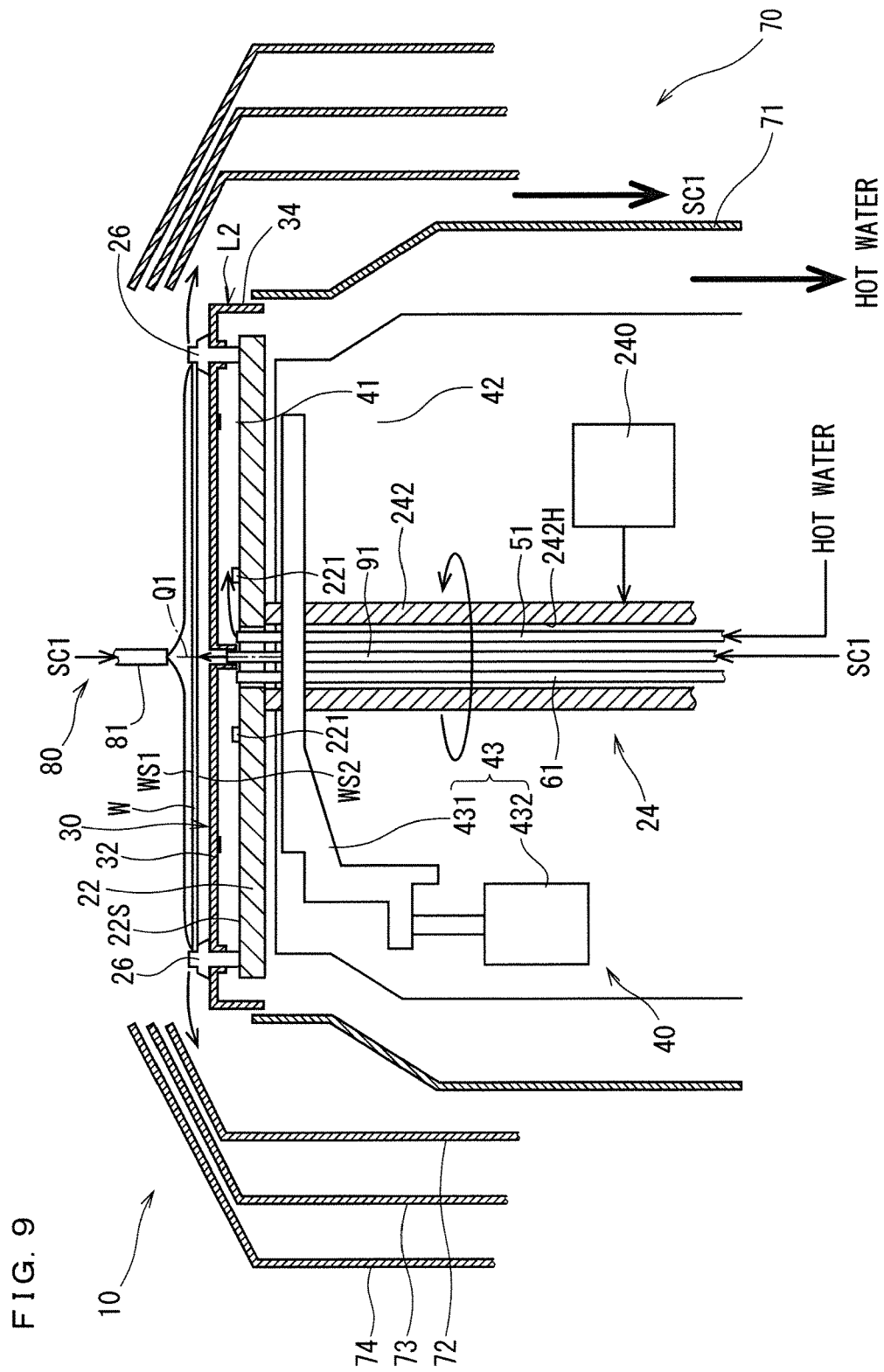

When a predetermined process time has elapsed since the start of the discharge of purified water, the discharge of the purified water from the front-surface-side nozzle 81 is stopped, and an SC-1 paddling step is performed to replace the purified water on the substrate W with SC-1. Specifically, as illustrated in FIG. 9, SC-1 is discharged from the front-surface-side nozzle 81 and the back-surface-side nozzle 91 while keeping the rotation speed of the substrate W at the paddle speed. In addition, the substrate W is temperature-regulated in this SC-1 paddling step. Specifically, the plate member moving mechanism 40 is operated to move the plate member 30 from the first position L1 to the second position L2. Then, hot water (for example, purified water at 40° C.) is supplied between the plate member 30 and the rotation table 22 from the heating nozzle 51 of the heating fluid supply unit 50. This hot water temperature-regulates the substrate W. The front surface WS1 of the substrate W is processed with the paddle-like SC-1, and the back surface WS2 is processed with the SC-1 supplied between the substrate W and the plate member 30.

Figure 10:
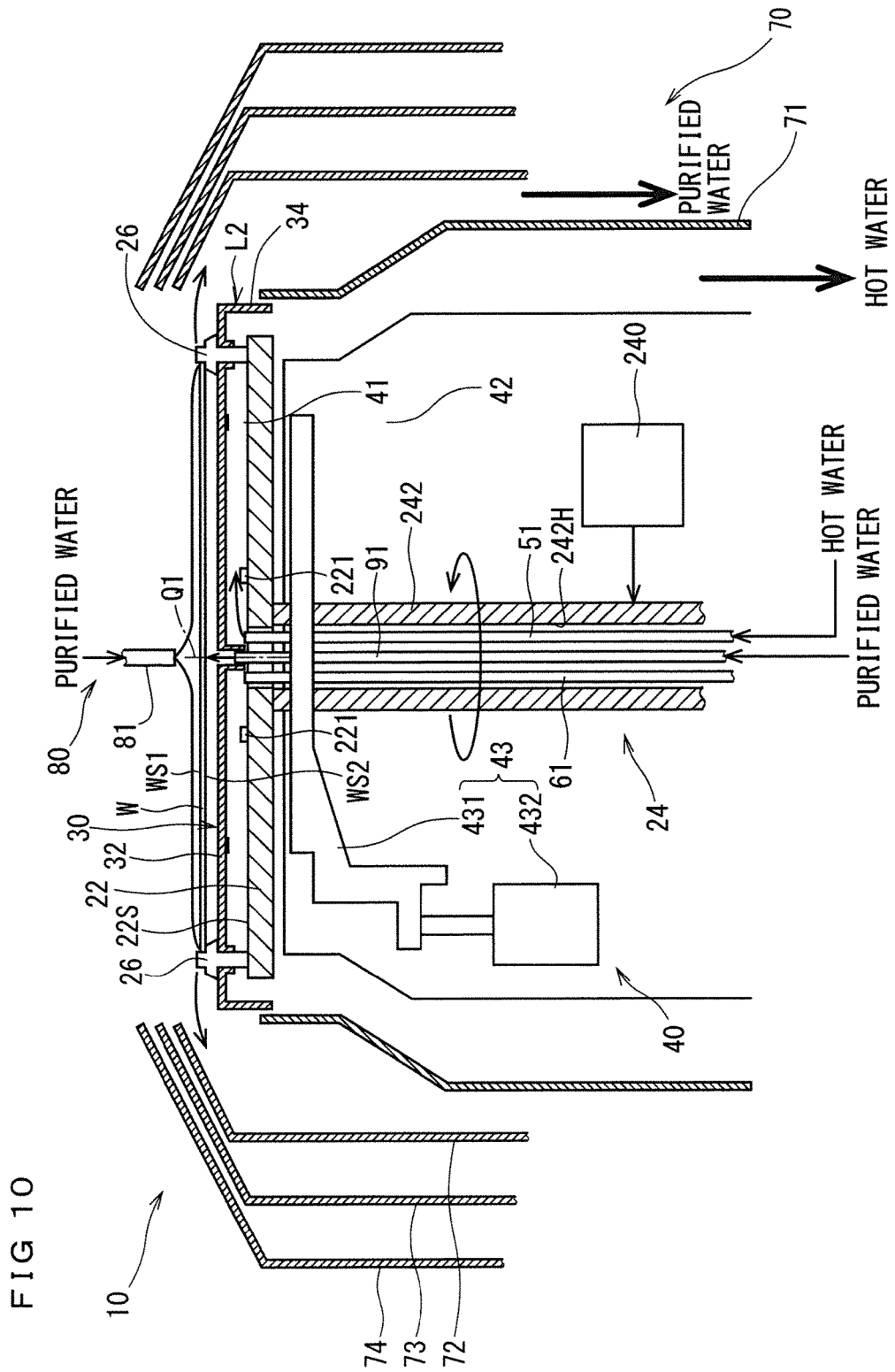

When a predetermined process time has elapsed since the start of the discharge of SC-1, the discharge of the SC-1 from the front-surface-side nozzle 81 is stopped, and a paddle rinsing step is performed to replace the SC-1 on the substrate W with a rinsing liquid (purified water). Specifically, as illustrated in FIG. 10, purified water is discharged to the front surface WS1 of the substrate W from the front-surface-side nozzle 81 while keeping the rotation speed of the substrate W at the paddle speed. Further, purified water is discharged from the back-surface-side nozzle 91 toward the back surface WS2 of the substrate W.

When a predetermined time has elapsed, the SC-1 has been replaced with a paddle-like purified water liquid film, on the front surface WS1 of the substrate W, and the SC-1 has also been replaced with purified water, on the front surface WS2 side. The purified water flowing to the lateral side of the substrate W is received by the first cup 71 and is discharged. Also in this paddle rinsing step, the substrate W is temperature-regulated by the hot water (for example, purified water at 40° C.) supplied from the heating nozzle 51. However, the temperature regulation of the substrate W may be stopped by stopping the supply of the hot water. Note that, also in the case of stopping the supply of the hot water, it is also possible to position the plate member 30 close to the substrate W (for example, keeping the position of the plate member 30 at the second position L2) so as to reduce the space between the substrate W and the plate member 30. By this operation, it is possible to reduce the amount of the purified water used to process the back surface WS2 of the substrate W.

Figure 11:
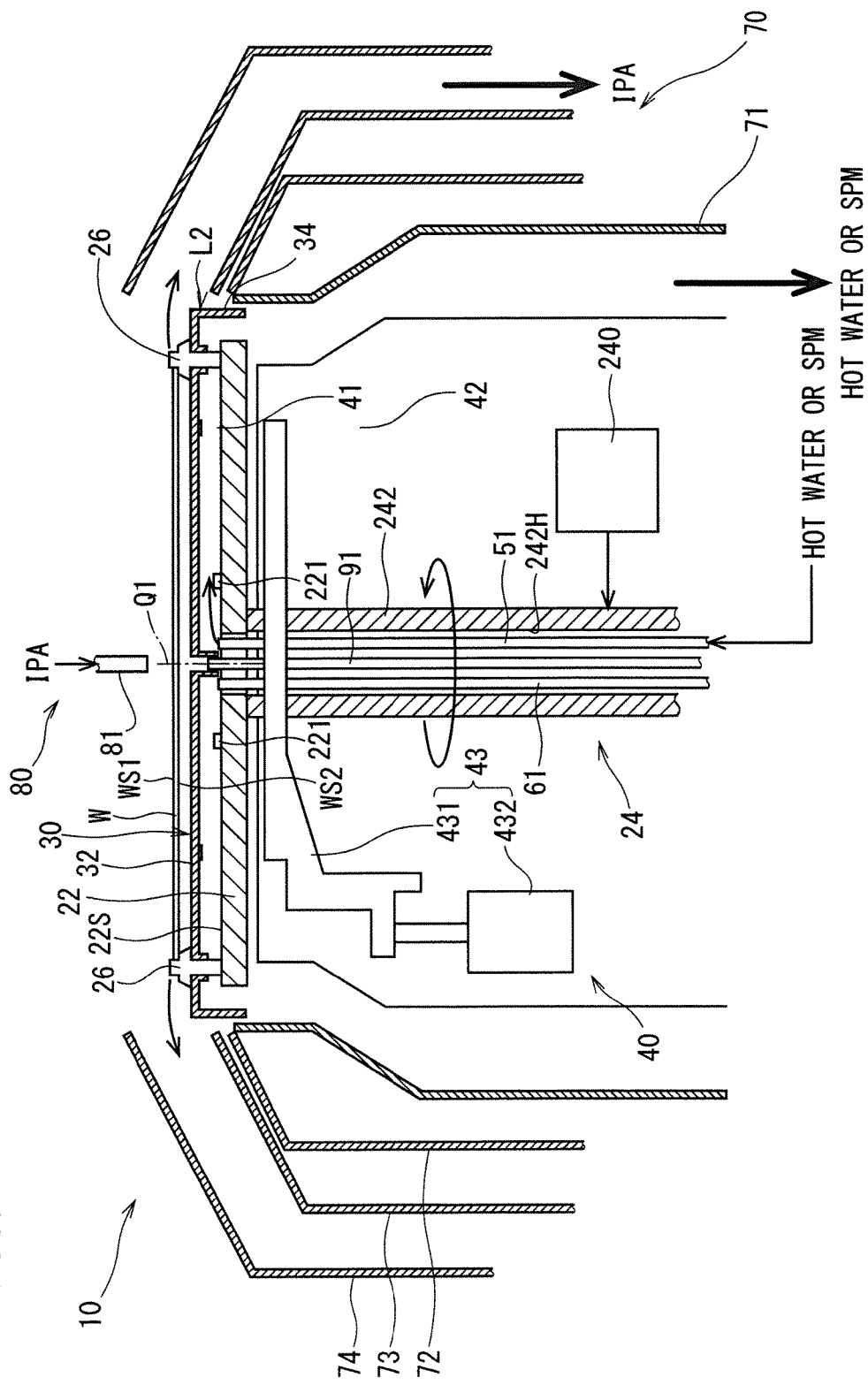

When a predetermined process time has elapsed since the start of the discharge of purified water, the discharge of the purified water from the front-surface-side nozzle 81 is stopped, and an IPA paddling step is performed in which IPA is discharged to replace the purified water liquid film on the substrate W with IPA. Specifically, as illustrated in FIG. 11, IPA is discharged from the front-surface-side nozzle 81 while keeping the rotation speed of the substrate W at the paddle speed. The discharge flow rate of the IPA from the front-surface-side nozzle 81 is set to 0.1 liters per minute, for example. By the IPA being supplied to the upper surface of the substrate W, the purified water on the front surface WS1 of the substrate W is gradually replaced with the IPA. As a result, a liquid film of IPA covering the entire upper surface of the substrate W is formed in a paddle shape on the upper surface of the substrate W. Further, the IPA scattering from the substrate W outwardly in the radial direction is received by the forth cup 74 and is discharged.

In the IPA paddling step, it is not specifically necessary to discharge IPA to the back surface WS2 of the substrate W. Further, the heating fluid discharged from the heating nozzle 51 temperature-regulates the substrate W. As the temperature regulating fluid, hot water at 80° C. or higher can be used, for example. Note that air having a relatively low thermal conductivity lies between the substrate W and the plate member 30 in the case that IPA is not discharged to the back surface WS, and thus it is difficult to efficiently temperature-regulate the substrate W. Therefore, it is preferable that heated fluid at higher temperatures (for example, SPM at 180° C.) be discharged from the heating nozzle 51.

When a predetermined process time has elapsed since the start of the discharge of IPA, the rotation speed of the substrate W is accelerated in stages from the paddle speed to a high rotation speed while discharging IPA. Then, after the substrate W reaches a high rotation speed, the discharge of IPA from the front-surface-side nozzle 81 is stopped, provided that a predetermined time has elapsed since the start of the discharge of IPA.

When the discharge of IPA is stopped, a drying step is performed. Specifically, the rotation speed of the substrate W is kept at a high rotation speed (for example, 600 to 1,200 rpm). This rotation shakes off the IPA attached to the substrate W, whereby the substrate W is dried. Further, in the drying step, hot water at 80° C. or SPM at 180° C. may be discharge from the heating nozzle 51 to heat the substrate W while the plate member 30 is being disposed at the second position L2.

Note that in the IPA paddling step, it is preferable that the front surface WS1 of the substrate W be heated up to a temperature higher than the boiling point of IPA (82.6° C.) after the liquid film of purified water on the front surface WS1 of the substrate W is replaced with a liquid film of IPA. By this operation, an evaporated gas film of IPA is formed, on the entire liquid film of IPA, between the liquid film of IPA and the front surface WS1 of the substrate W. Thus, the liquid film of IPA can be floated above the film of vaporized gas of IPA. In this state, since the magnitude of friction force generated between the front surface WS1 of the substrate W and the liquid film of IPA is substantially zero, the liquid film of IPA can be easily moved above the front surface WS1. Therefore, due to a high speed rotation of the substrate W, the floated liquid film of IPA can be effectively removed from above the front surface WS1 of the substrate W.

After the drying step is performed for a predetermined drying time, a carrying-out step is performed. Specifically, the discharge of heated fluid from the heating nozzle 51 is stopped. Further, the rotation of the substrate W is stopped, and cleaning processing on one substrate W is completed. Then, the conveyance robot CR carries out the processed substrate W from the substrate processing apparatus 10. Note that before the conveyance robot CR carries out the substrate W, the front-surface-side nozzle 81 is appropriately moved to a position not above the substrate W.

Further, the plate member moving mechanism 40 preferably descends to move the plate member 30 to the first position L1 before the conveyance robot CR carries out the substrate W. This operation can prevent or reduce excessive heating of the substrate W caused by the plate member 30 heated in the drying step. However, it is not necessary to move the plate member 30 to the first position L1 before carrying out the substrate W.

Further, the plate member 30 may be cooled after the substrate W is carried out and before the next substrate W is carried in. Specifically, the plate member 30 is disposed at the second position L2 and is rotated together with the rotation table 22. Then, a cooling fluid is preferably discharged from the cooling nozzle 61. Note that a room-temperature water may be supplied from the heating nozzle 51. By cooling the plate member 30 in this way, it is possible to prevent or reduce unnecessary heating of the unprocessed substrate W by the plate member 30 when the unprocessed substrate W is carried in.

Figure 12:
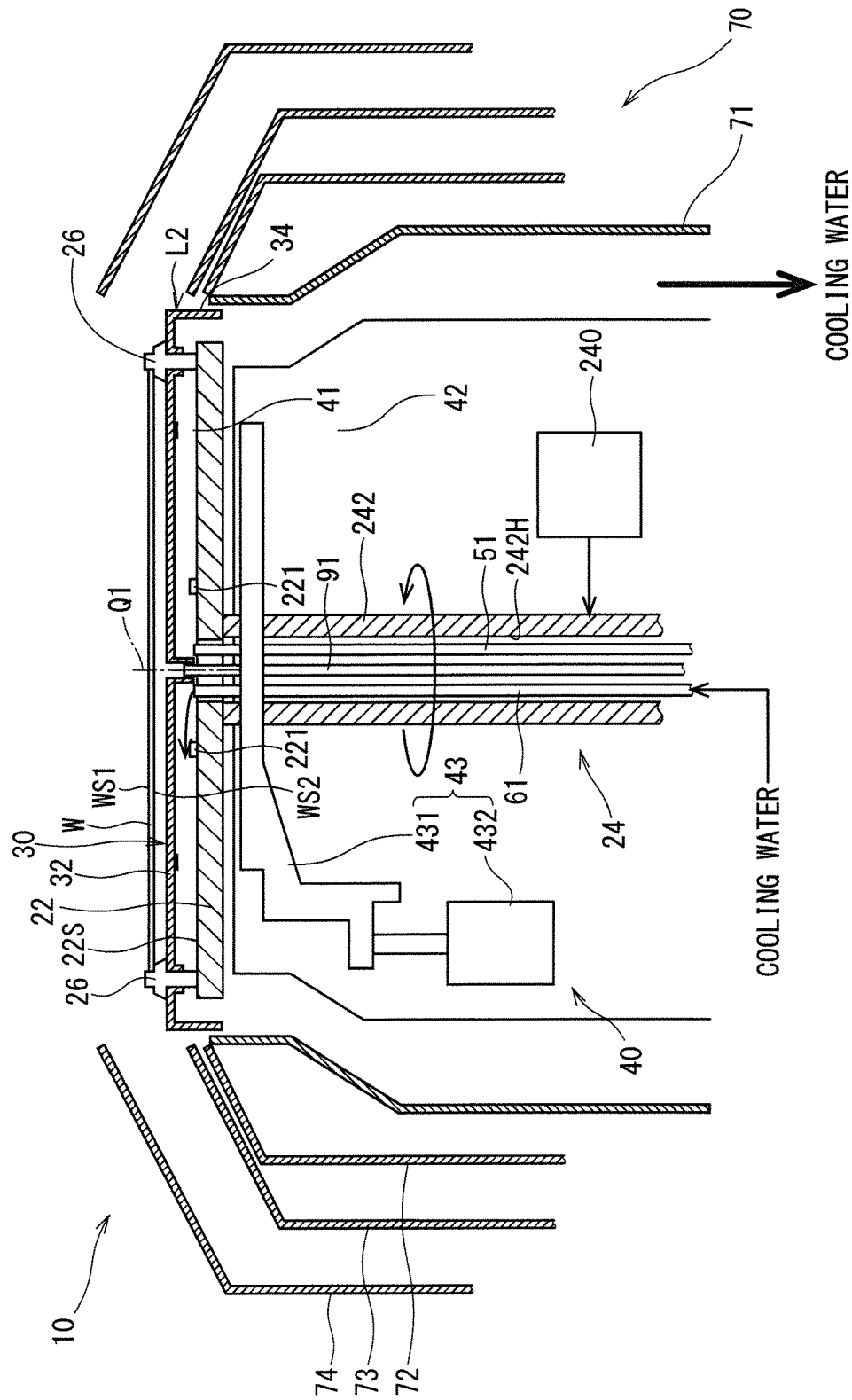

Further, a cooling fluid (cooling water or the like) may be discharged from the cooling nozzle 61 with the plate member 30 being disposed at the second position L2 as illustrated in FIG. 12 before the substrate W is carried out by the conveyance robot CR. This operation can quickly cool the substrate W; therefore, it is possible to prevent or reduce heating of a part of the conveyance robot CR which is in contact with the substrate W or deformation of the part caused by heat.

Other Operation Examples

In the substrate processing apparatus 10, it is possible to use a so-called freeze-cleaning technology. Specifically, it is preferable that purified water be supplied to the front surface WS1 or the back surface WS2 of the substrate W, and at the same time, a cooling fluid (cooling gas, liquid nitrogen, antifreeze liquid, and the like) colder than the freezing-point temperature of purified water be supplied into the plate member 30. The purified water supplied to the front surface WS1 or the back surface WS2 is frozen through this operation, and the cooling is then stopped; thus, particles stuck to the substrate W are effectively removed together with the frozen purified water.

2. Second Preferred Embodiment

Next, a second preferred embodiment according to the present invention will be described. In the following description, components having the same functions as those described above are designated by like reference numerals and characters or like reference numerals and characters with alphabetic characters appended thereto, and will not be described in detail in some cases.

Figure 13:
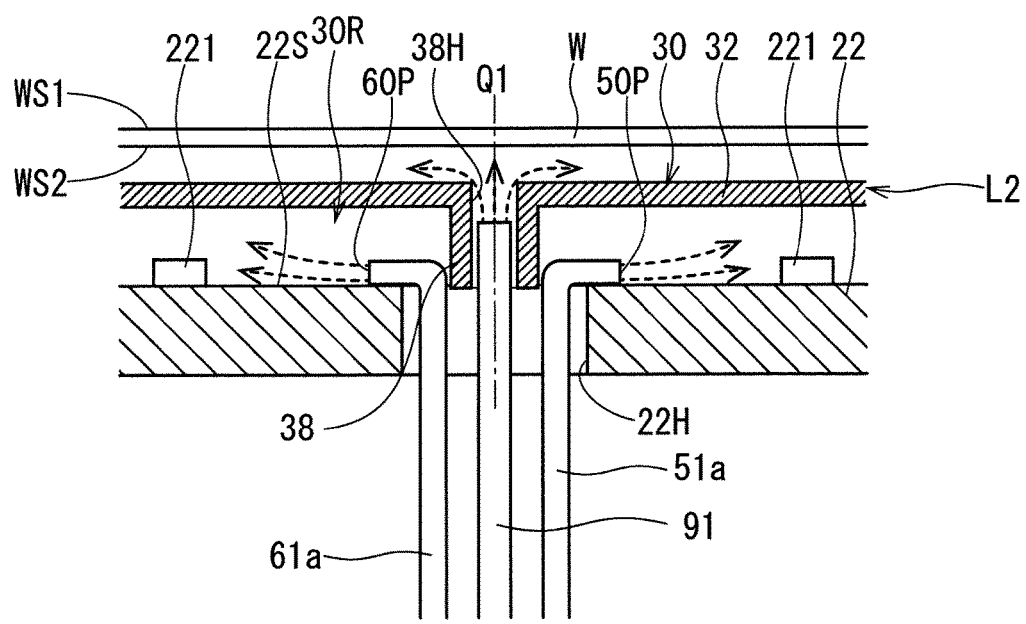
FIG. 13 is a schematic sectional view of the vicinity of the central part of a plate member 30 of a second preferred embodiment.

FIG. 13 is a schematic sectional view of the vicinity of the center of a plate member 30 of the second preferred embodiment. A discharge port 50P of a heating nozzle 51a and a discharge port 60P of a cooling nozzle 61a of the present preferred embodiment are directed outwardly in the radial direction of a rotation table 22 in a temperature regulating space 30R. With this arrangement, temperature regulating fluids discharged from the discharge ports 50P and 60P can be smoothly moved outwardly in the radial direction of the rotating rotation table 22; thus, it is possible to temperature-regulate the plate member 30 favorably in the radial direction.

3. Third Preferred Embodiment

Figure 14:
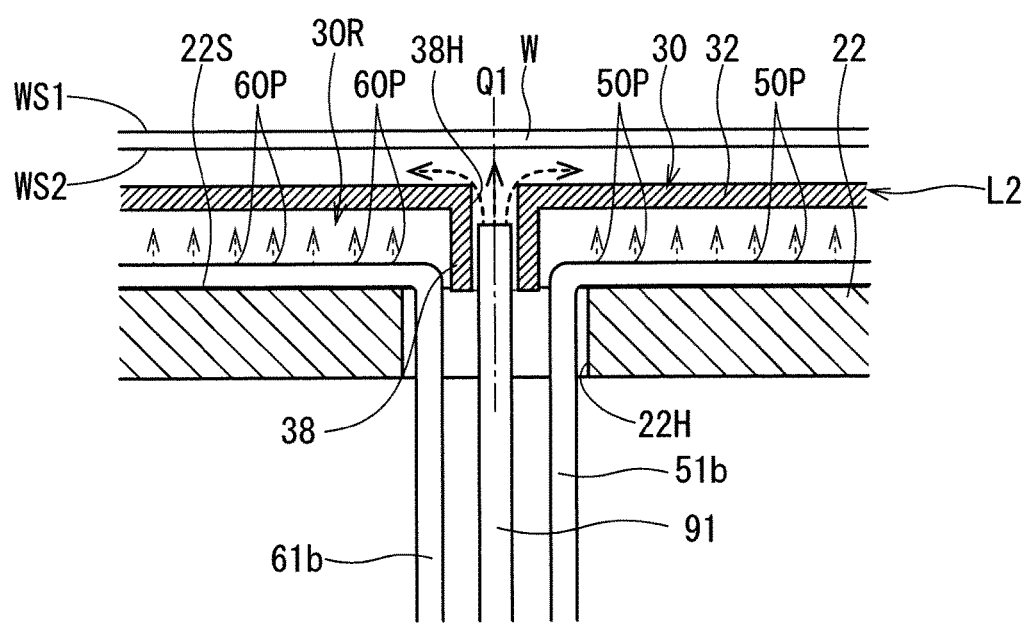
FIG. 14 is a schematic sectional view of the vicinity of the central part of a plate member 30 of a third preferred embodiment.

FIG. 14 is a schematic sectional view of the vicinity of the center of a plate member 30 of a third preferred embodiment. The tip end part of a heating nozzle 51b and the tip end part of a cooling nozzle 61b of the present preferred embodiment are extended from a through-hole 22H of a rotation table 22 into a temperature regulating space 30R and are then extended outwardly in the radial direction of the rotation table 22. In the tip end parts, of the heating nozzle 51b and the cooling nozzle 61b, extending outwardly in the radial direction, there are formed a plurality of discharge ports 50P and a plurality of discharge ports 60P at predetermined intervals. Since temperature regulating fluids are discharged from the tip end parts extending outwardly in the radial direction of the rotation table 22 in the temperature regulating space 30R as described above, the temperature regulating fluids can be supplied favorably in the temperature regulating space 30R, and the plate member 30 can be uniformly temperature-regulated. Therefore, the substrate W can be uniformly temperature-regulated.

Note that it is also possible to extend the tip end part of the heating nozzle 51b or the cooling nozzle 61b to a position outside the substrate W and to supply, from the plurality of discharge ports 50P or the plurality of discharge ports 60P, the temperature regulating fluid over the entire substrate W in the radial direction. With this arrangement, the substrate W can be more uniformly temperature-regulated. However, the tip end parts of the heating nozzles 51b and 61b may be extended to the inside of the substrate W.

4. Modified Example

Although the preferred embodiments are described above, the present invention is not limited to the above examples, and various modifications can be done.

Figure 15:
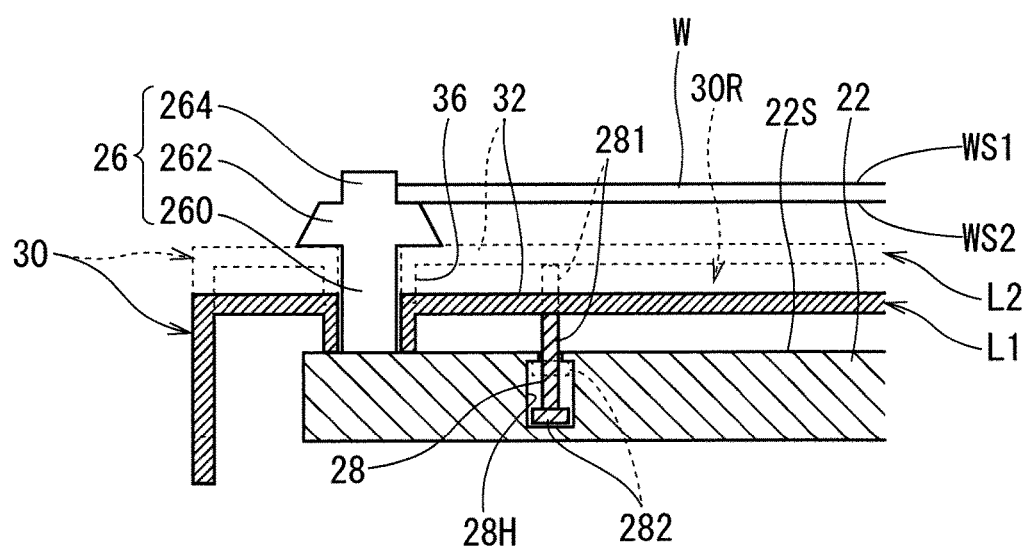
FIG. 15 is a side view schematically illustrating the vicinity of an outer edge of a plate member 30 of a modified example.

For example, in the above first preferred embodiment, each of the substrate holding members 26 is provided with the wide part 262 so as to stop the plate member 30 at the second position L2. However, it is not necessary to use the substrate holding members 26 to position the plate member 30. For example, a locking member 28 may be provided on the plate member 30 side as illustrated in FIG. 15.

The locking member 28 is a member connected to the lower surface of the base part 32 of the plate member 30. The locking member 28 is equipped with: a rod-like part 281 formed in a columnar shape; and a locking part 282 which is provided at the lower end of the rod-like part 281 and is wider in the horizontal direction than the rod-like part 281.

In addition, the surface 22S of the rotation table 22 is provided with a locking hole 28H in which the locking part 282 of the locking member is locked. The size of an opening of the upper end of the locking hole 28H (an opening diameter in the horizontal direction) is large enough for the rod-like part 281 to move vertically but is smaller than the locking part 282.

When the plate member 30 is moved up by the plate member moving mechanism 40, the locking part 282 of the locking member 28 is locked by the upper part of the locking hole 28H. By appropriately adjusting the length of the rod-like part 281, the plate member 30 can be stopped at the second position L2 by the locking member 28.

In the above preferred embodiments, the descriptions are given to the case where the process object of the substrate processing apparatus is a semiconductor wafer. However, the substrate which is a process object of the present invention may a glass substrate for a photomask, a glass substrate for a plasma display, a glass or ceramic substrate for a magnetic or optical disk, a glass substrate for a liquid crystal display device, a glass substrate for an organic EL, a glass substrate or a silicon substrate for a solar cell, in addition, various substrates for electronic equipment such as a flexible circuit board and a printed circuit board.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus for processing a substrate comprising:
    a rotation table which rotates around a predetermined rotation axial line, and which is larger in horizontal directions than a diameter of said substrate;
    a rotational driver which rotates said rotation table around said rotation axial line;
    a substrate holder which is provided on a surface on one side of said rotation table and supports the substrate while being in contact with the circumferential edge part of the said substrate, away from said rotation table, at a position on said one side;
    a plate member which has a base part opposed to said surface on said one side of said rotation table and is rotated, by said rotational driver, together with said rotation table while said base part is being disposed between said rotation table and said substrate held by said substrate holder, said base part being larger in horizontal directions than said rotation table; and
    a temperature regulating fluid supplier having a discharge port, said temperature regulating fluid supplier supplying, between said rotation table and said plate member, a temperature regulating fluid from said discharge port for temperature regulation of said plate member.

2. The substrate processing apparatus according to claim 1, further comprising
    a plate member mover including at least one magnet, said plate member mover moving said plate member between (i) a first position which is on said one side with respect to said rotation table and (ii) a second position which is closer to a back surface of said substrate held by said substrate holder than said first position is.

3. The substrate processing apparatus according to claim 2, wherein said at least one magnet includes:
    a first magnet part provided on said plate member; and a second magnet part provided on the other side with respect to said rotation table to provide a repelling force to said first magnet part, wherein said plate member mover includes a relative movement supporter which supports said second magnet part and moves said second magnet part relatively closer to or further away from said first magnet part, wherein at least one of said first magnet part and said second magnet part has a circular ring shape centering on said rotation axial line as a central axis.

4. The substrate processing apparatus according to claim 1, further comprising a temperature regulating fluid discharger including a member formed in a cylindrical shape which surrounds said rotation table, said temperature regulating fluid discharger discharging said temperature regulating fluid, wherein said plate member includes a first skirt part which has a cylindrical shape and is formed to extend in an annular shape downwardly extending in a vertical direction, at a position outside of said rotation table, from said base part which extends larger than said rotation table, toward a side of said rotation table, and wherein said temperature regulating fluid discharger discharges said temperature regulating fluid which has hit said first skirt part and has dropped.

5. The substrate processing apparatus according to claim 4, wherein said first skirt part has a length such that a lower end of said first skirt part is lower than said surface of said rotation table and is lower than an upper end of said temperature regulating fluid discharger surrounding said first skirt part when said plate member is disposed at said second position.

6. The substrate processing apparatus according to claim 1, wherein said plate member is provided with an insertion hole through which said substrate holder is inserted, and extends larger than said substrate held by said substrate holder.

7. The substrate processing apparatus according to claim 6, wherein said plate member includes a second skirt part which has a cylindrical shape and extends from said base part toward said rotation table such that said second skirt part forms a hole continuing to said insertion hole, through which said substrate holder is inserted.

8. The substrate processing apparatus according to claim 1, further comprising a back-surface-side nozzle between said substrate held by said substrate holder and said plate member, wherein said back-surface-side nozzle discharges fluid for back surface processing, wherein said plate member has a through-hole formed at a position overlapping said rotation axial line, and said back-surface-side nozzle is inserted through said through-hole.

9. The substrate processing apparatus according to claim 8, wherein said plate member includes a third skirt part which has a cylindrical shape and extends from said base part toward said rotation table such that said third skirt part forms a hole continuing to said through-hole, through which said back-surface-side nozzle is inserted.

10. The substrate processing apparatus according to claim 9, wherein said temperature regulating fluid supplier discharges said temperature regulating fluid, at a position on an outside in a radial direction of said third skirt part of said plate member, outwardly in said radial direction.

11. The substrate processing apparatus according to claim 9, wherein said discharge port is disposed higher than said surface of said rotation table, said discharge port is disposed at a position on an outside, in a radial direction, of said third skirt part, said discharge port is opened in a direction inclined, outwardly in a radial direction of said plate member, with respect to a vertical direction or is opened in an upper direction of said vertical direction, and said discharge port discharges said temperature regulating fluid between a surface of said base part facing a direction opposite to said one side and said surface on said one side of said rotation table.

12. The substrate processing apparatus according to claim 1, wherein said plate member is made of a material containing silicon or silicon carbide.

13. The substrate processing apparatus according to claim 1, wherein said temperature regulating fluid contains helium gas.

14. The substrate processing apparatus according to claim 1, wherein said one side faces a vertically upper direction, and a surface of said base part facing a direction opposite to said one side and said surface on said one side of said rotation table are opposed to each other.

* * * * *